United States Patent
Sun

(10) Patent No.: US 10,048,959 B2
(45) Date of Patent: Aug. 14, 2018

(54) METHOD AND APPARATUS FOR INCREMENTAL UPGRADE

(71) Applicant: GUANGZHOU UCWEB COMPUTER TECHNOLOGY CO., LTD., Guangzhou (CN)

(72) Inventor: Xiaozhi Sun, Guangzhou (CN)

(73) Assignee: Guangzhou UCWEB Computer Technology Co., Ltd., Guangzhou, Guangdong (CN)

( * ) Notice: Subject to any disclaimer, the term of this patent is extended or adjusted under 35 U.S.C. 154(b) by 0 days.

(21) Appl. No.: 15/315,272

(22) PCT Filed: Sep. 18, 2014

(86) PCT No.: PCT/CN2014/086816
§ 371 (c)(1),
(2) Date: Nov. 30, 2016

(87) PCT Pub. No.: WO2015/180304
PCT Pub. Date: Dec. 3, 2015

(65) Prior Publication Data
US 2017/0249140 A1 Aug. 31, 2017

(30) Foreign Application Priority Data

May 30, 2014 (CN) .......................... 2014 1 0238919

(51) Int. Cl.
*G06F 8/658* (2018.01)
*H03M 7/30* (2006.01)

(52) U.S. Cl.
CPC .............. *G06F 8/658* (2018.02); *H03M 7/30* (2013.01)

(58) Field of Classification Search
CPC ............................................. G06F 8/60–8/68
(Continued)

(56) References Cited

U.S. PATENT DOCUMENTS 6,493,871 B1 * 12/2002 McGuire .................. G06F 8/65
717/169
7,143,115 B2 * 11/2006 Jones ....................... G06F 8/68
707/625
(Continued)

FOREIGN PATENT DOCUMENTS

CN 102523268 6/2012
CN 103051723 4/2013
(Continued)

OTHER PUBLICATIONS

Stolikj, M., et al., Patching a Patch—Software Updates Using Horizontal Patching, IEEE Transactions on Consumer Electronics, vol. 59, Issue: 2, May 2013, pp. 435-441, [retrieved on Apr. 18, 2018], Retrieved from the Internet: <URL:http://ieeexplore.ieee.org/>.*

(Continued)

*Primary Examiner* — Geoffrey St. Leger
(74) *Attorney, Agent, or Firm* — Alston & Bird LLP

(57) ABSTRACT

Disclosed is a method and an apparatus for incremental upgrade. When a server generates an incremental file, it acquires sub-files of different types in an old version compressed file and a new version compressed file, and performs different difference comparison steps on the sub-files of different types, to obtain difference data files for corresponding types: for sub-files that satisfy a preset decompression condition, a decompression comparison method is used to perform difference comparison, and for sub-files that do not satisfy the preset decompression condition, a direct comparison method is used to perform difference comparison; subsequently, a client acquires the difference data files from the server, and according to the type of a difference data file, carries out a merge operation on the difference data file and (Continued)

the old version compressed file to obtain the new version compressed file.

22 Claims, 9 Drawing Sheets

(58) Field of Classification Search
USPC .................................................. 717/168–178
See application file for complete search history.

(56) References Cited

U.S. PATENT DOCUMENTS

| | | | | |
|---|---|---|---|---|
| 7,898,442 | B1* | 3/2011 | Sovik | H03M 7/3088 341/51 |
| 8,326,811 | B2* | 12/2012 | Kamei | G06F 3/0608 707/693 |
| 8,418,167 | B2* | 4/2013 | Meller | G06F 8/665 717/168 |
| 8,639,671 | B2* | 1/2014 | Luo | G06F 17/30312 707/693 |
| 9,075,693 | B2* | 7/2015 | Sporkert | G06F 8/68 |
| 9,367,303 | B2* | 6/2016 | Deng | G06F 8/65 |
| 9,779,119 | B2* | 10/2017 | Page | G06F 17/30309 |
| 2004/0210551 | A1* | 10/2004 | Jones | G06F 8/68 |
| 2006/0136523 | A1* | 6/2006 | Lien | G06F 8/65 |
| 2007/0083571 | A1* | 4/2007 | Meller | G06F 8/665 |
| 2008/0216066 | A1* | 9/2008 | Oh | G06F 8/658 717/173 |
| 2011/0320417 | A1* | 12/2011 | Luo | H03M 7/30 707/693 |
| 2012/0102005 | A1* | 4/2012 | Kamei | G06F 3/0608 707/693 |
| 2012/0131566 | A1* | 5/2012 | Morgan | G06F 8/65 717/170 |
| 2014/0007075 | A1* | 1/2014 | Sporkert | G06F 8/68 717/173 |
| 2014/0013006 | A1* | 1/2014 | Schillinger | G06F 8/68 709/247 |
| 2014/0081922 | A1 | 3/2014 | Kunath et al. | |
| 2014/0281165 | A1* | 9/2014 | Moschopoulos | G06F 3/0619 711/103 |
| 2015/0277898 | A1* | 10/2015 | Deng | G06F 8/65 717/171 |
| 2016/0004530 | A1 | 1/2016 | Liang et al. | |

FOREIGN PATENT DOCUMENTS

| | | |
|---|---|---|
| CN | 103095838 | 5/2013 |
| CN | 103713928 | 4/2014 |
| CN | 103714105 | 4/2014 |
| CN | 105404521 | 3/2016 |

OTHER PUBLICATIONS

Stolikj, M., et al., Efficient reprogramming of wireless sensor networks using incremental updates, 2013 IEEE International Conference on Pervasive Computing and Communications Workshops (PERCOM Workshops), pp. 584-589, [retrieved on Apr. 18, 2018], Retrieved from the Internet: <URL:http://ieeexplore.ieee.org/>.*

International Search Report and Written Opinion for corresponding International Application No. PCT/CN2014/086816, dated Feb. 26, 2015.

Office Action for corresponding Chinese Application No. 201410238919.4 dated Mar. 23, 2016.

* cited by examiner

| file_11 | A01 |   | file_21 | B01 |
| file_12 | A02 |   | file_22 | B02 | old version compressed file   new version compressed file

Fig. 4

| file_11 | C01 |   | file_21 | D01 |
| file_12 | C02 |   | file_22 | D02 | first cache            second cache

Fig. 5

METHOD AND APPARATUS FOR INCREMENTAL UPGRADE

CROSS-REFERENCE TO RELATED APPLICATION

This application claims priority to and the benefit of PCT/CN2014/086816, filed Sep. 18, 2014, which claims priority and the benefit of Chinese Patent Application Serial No. 201410238919.4, filed with the State Intellectual Property Office of P.R. China on May 30, 2014, the entire contents each of which is incorporated herein by reference in its entirety.

FIELD OF THE INVENTION

The present application relates to the field of data processing technologies, and in particular to a method and an apparatus for incremental upgrade.

DESCRIPTION OF THE RELATED ART

Version upgrade refers to an improvement on loopholes of an old version of an operating system or software, or an update to add new application functions to software such that the software is further improved and easier to use. As a common version upgrade method, incremental upgrade has the fundamental principle that a server compares an old version file with a new version file, generates an incremental file for recording the difference information between the old version file and the new version file; a client downloads the incremental file, merges the incremental file with its own old version file to obtain a corresponding new version file, and the version upgrade is completed after the new version file is installed. Relative to ways to implement upgrade by downloading an entire new version file, the above incremental upgrade method consumes less data traffic, takes a shorter time, and achieves a higher upgrade efficiency, and as a result, it has been extensively applied.

Typically, all version files are compressed files comprising a plurality of sub-files. In light of this, an incremental file is obtained in a conventional incremental upgrade process mainly with the direct comparison method or decompression comparison method.

Wherein, the direct comparison method treats an old version file and a new version file as an integral file, respectively, for direct comparison; this method has relatively high comparison efficiency, but the obtained incremental file could be very large, even close to the size of the new version file, which is not favorable for a client to download said incremental file. For example, relative to an old version file, none of the corresponding sub-files in a new version file is revised, only the compression sequence of the sub-files is changed, but from the angle of an integral file, the two files are still completely different, and as a result, the incremental file obtained using the direct comparison method could be very large.

According to the decompression comparison method, specifically, sub-files in an old version file and a new version file are decompressed, respectively, and corresponding sub-files (e.g. with the same file name) obtained after decompression in the old version file and the new version file are compared to obtain an incremental file. Relatively to the direct comparison method, the decompression comparison method can solve the problem that changes to the sequence of sub-files lead to relatively huge overall file differences and effectively reduce the size of incremental files, but several thousand decompression and re-compression operations are typically required during the implementation process, leading to a relatively low upgrade efficiency.

SUMMARY OF THE INVENTION

Embodiments of the present application provide a method and an apparatus for incremental upgrade to solve the problem that common methods for incremental upgrade are unable to take care of the incremental file size and upgrade efficiency at the same time.

To solve the above technical problem, embodiments of the present application disclose the following technical solution:

A first aspect of the present application provides a method for incremental upgrade, comprising:

a server acquires at least one of a first type sub-file, a second type sub-file, and a third type sub-file; wherein the first type sub-file is a file existing in a new version compressed file, but not in an old version compressed file; the second type sub-file is a file existing in both a new version compressed file and an old version compressed file, and both satisfy a preset decompression condition, including a second type sub-file in a new version compressed file and a second type sub-file in an old version compressed file; the third type sub-file is a file existing in both a new version compressed file and an old version compressed file, and not satisfying, in part or wholly, the preset decompression condition, including a third type sub-file in a new version compressed file and a third type sub-file in an old version compressed file;

when the acquired file comprises a second type sub-file, the server decompresses the second type sub-file in the new version compressed file and the second type sub-file in the corresponding old version compressed file, and performs difference comparison to obtain a first difference data file;

when the acquired file comprises a third type sub-file, the server directly performs difference comparison between the third type sub-file in the new version compressed file and the third type sub-file in the corresponding old version compressed file without decompression, to obtain a second difference data file;

according to the acquired at least one of the first type sub-file, the first difference data file and the second difference data file, the server generates an incremental file for a client to perform incremental upgrade of the file.

A second aspect of the present application provides a method for incremental upgrade, comprising:

a client acquires an incremental file from a server, wherein the incremental file comprises at least one of a first type sub-file, a first difference data file and a second difference data file; wherein the first type sub-file is a file existing in a new version compressed file, but not in an old version compressed file; the first difference data file is a file obtained by decompressing the second type sub-file in the new version compressed file and the second type sub-file in the corresponding old version compressed file, and performing difference comparison, the second type sub-file being a file existing in both a new version compressed file and an old version compressed file, and both satisfy a preset decompression condition; the second difference data file is a file obtained by directly performing difference comparison between the third type sub-file in the new version compressed file and the third type sub-file in the corresponding old version compressed file without decompression, the third type sub-file being a file existing in both a new version compressed file and an old version compressed file, and not satisfying, in part or wholly, the preset decompression condition;

the client uses the incremental file to obtain a new version compressed file, comprising: when the incremental file comprises a first type sub-file, a first difference data file and a second difference data file, decompressing the second type sub-file in the old version compressed file, then merging with the first difference data file to obtain a first merged sub-file, and compressing the first merged sub-file to obtain a first compressed sub-file; merging the third type sub-file in the old version compressed file with the second difference data file to obtain a second merged sub-file, and compressing the second merged sub-file to obtain a second compressed sub-file; merging the first compressed sub-file, the second compressed sub-file, and the first type sub-file to obtain a new version compressed file;

the client uses the new version compressed file to perform incremental upgrade of a file.

A third aspect of the present application provides a server, comprising:

a first acquisition module, configured to acquire at least one of a first type sub-file, a second type sub-file, and a third type sub-file; wherein the first type sub-file is a file existing in a new version compressed file, but not in an old version compressed file; the second type sub-file is a file existing in both a new version compressed file and an old version compressed file, and both satisfy a preset decompression condition, including a second type sub-file in a new version compressed file and a second type sub-file in an old version compressed file; the third type sub-file is a file existing in both a new version compressed file and an old version compressed file, and not satisfying, in part or wholly, the preset decompression condition, including a third type sub-file in a new version compressed file and a third type sub-file in an old version compressed file;

a first comparison module, configured to, when the acquired file comprises a second type sub-file, decompress the second type sub-file in the new version compressed file and the second type sub-file in the corresponding old version compressed file, and perform difference comparison to obtain a first difference data file;

a second comparison module, configured to, when the acquired file comprises a third type sub-file, directly perform difference comparison between the third type sub-file in the new version compressed file and the third type sub-file in the corresponding old version compressed file without decompression, to obtain a second difference data file;

a generation module, configured to, according to the acquired at least one of the first type sub-file, the first difference data file and the second difference data file, generate an incremental file for a client to perform incremental upgrade of the file.

A fourth aspect of the present application provides a client, comprising:

a second acquisition module, configured to acquire an incremental file from a server, wherein the incremental file comprises at least one of a first type sub-file, a first difference data file and a second difference data file; wherein the first type sub-file is a file existing in a new version compressed file, but not in an old version compressed file; the first difference data file is a file obtained by decompressing the second type sub-file in the new version compressed file and the second type sub-file in the corresponding old version compressed file, and performing difference comparison, the second type sub-file being a file existing in both a new version compressed file and an old version compressed file, and both satisfy a preset decompression condition; the second difference data file is a file obtained by directly performing difference comparison between the third type sub-file in the new version compressed file and the third type sub-file in the corresponding old version compressed file without decompression, the third type sub-file being a file existing in both a new version compressed file and an old version compressed file, and not satisfying, in part or wholly, the preset decompression condition;

a second merging module, configured to use the incremental file to obtain a new version compressed file, comprising: when the incremental file comprises a first type sub-file, a first difference data file and a second difference data file, decompressing the second type sub-file in the old version compressed file, then merging with the first difference data file to obtain a first merged sub-file, and compressing the first merged sub-file to obtain a first compressed sub-file; merging the third type sub-file in the old version compressed file with the second difference data file to obtain a second merged sub-file, and compressing the second merged sub-file to obtain a second compressed sub-file; merging the first compressed sub-file, the second compressed sub-file, and the first type sub-file to obtain a new version compressed file;

an incremental upgrade module, configured to use the new version compressed file to perform incremental upgrade of a file.

A fifth aspect of the present application provides a computer program comprising program commands, when said computer program runs on a server, the server is triggered to carry out the above method for incremental upgrade at the server side.

A sixth aspect of the present application provides a computer readable medium, wherein the computer program according to the fifth aspect is stored.

A seventh aspect of the present application provides another computer program comprising program commands, when said computer program runs on a client, the client is triggered to carry out the above method for incremental upgrade at the client side.

An eighth aspect of the present application provides another computer readable medium, wherein the computer program according to the seventh aspect is stored.

It can be seen from the above technical solution that, when a server generates an incremental file in the embodiments of the present application, it first acquires sub-files of different types in an old version compressed file and a new version compressed file, and then performs different difference comparison steps on the sub-files of different types, to obtain difference data files for corresponding types. Subsequently, for sub-files that satisfy a preset decompression condition, a decompression comparison method is used to perform difference comparison, which can reduce the size of difference data, and for sub-files that do not satisfy the preset decompression condition, a direct comparison method is used to perform difference comparison, which can improve the efficiency of difference comparison. Furthermore, according to the acquired at least one of the first type sub-file, the first difference data file and the second difference data file, the server generates an incremental file for a client to perform incremental upgrade of the file. Correspondingly, when a client acquires an incremental file from a server, it may carry out different operations according to types of sub-files in the incremental file, to obtain a new version compressed file. With respect to a difference data file, in particular, a merge operation on the difference data file and the old version compressed file can be carried out, according to the type of the difference data file, to obtain the new version compressed file, which then improves the efficiency of merge operation. Compared with conventional incremental upgrade achieved by solely using the direct comparison method or the decompression comparison method, therefore, the present application can attain a goal of taking care of both the incremental file size and the upgrade efficiency at the same time.

BRIEF DESCRIPTION OF THE DRAWINGS

To more clearly describe embodiments of the present application or technical solutions according to the prior art, the accompanying drawings to be used in the description of the embodiments or the prior art will be briefly described. Apparently, to those skilled in the art, other drawings may be further derived from these drawings without innovative labor.

FIG. 4 is a schematic diagram of a memory structure of an old version compressed file and a new version compressed file according to an embodiment of the present application;

FIG. 5 is a schematic diagram of a memory structure of a first cache and a second cache according to an embodiment of the present application;

DETAILED DESCRIPTION OF THE SPECIFIC EMBODIMENTS

Embodiments of the present application provide a method and an apparatus for incremental upgrade to solve the problem that common methods for incremental upgrade are unable to take care of the incremental file size and upgrade efficiency at the same time.

To enable those skilled in the art to better understand the technical solution according to the present application, the technical solution according to embodiments of the present application will be clearly and completely described below with reference to the accompanying drawings in embodiments of the present application. Apparently, the embodiments to be described are only some, not all, embodiments of the present application. All other embodiments derived by those skilled in the art from the embodiments of the present application without innovative labor shall be encompassed by the present application.

Figure 1:
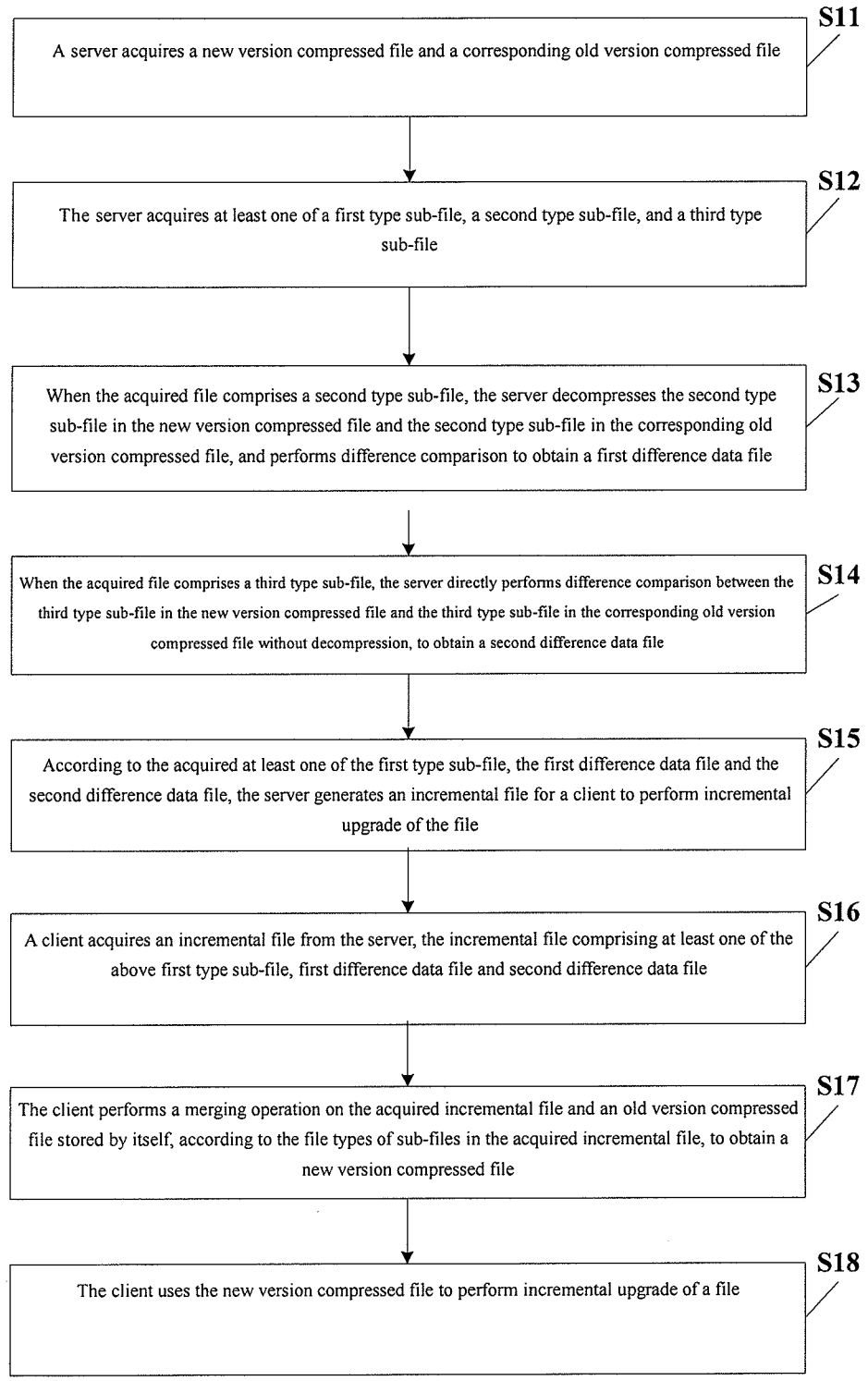
FIG. 1 is a flow chart of a method for incremental upgrade according to an embodiment of the present application.

FIG. 1 is a flow chart of a method for incremental upgrade according to an embodiment of the present application.

The present embodiment will first describe the method for incremental upgrade according to the present application from the angle of an integral system comprising a server and a client. See FIG. 1, the method for incremental upgrade according to the present embodiment comprises the following steps:

S11. The server acquires a new version compressed file and a corresponding old version compressed file.

Optionally, an embodiment of the present application may determine corresponding two compressed files according to file names and/or version identifiers, and then, according to version numbers of the two compressed files, determine which compressed file is the old version compressed file, and which compressed file is the new version compressed file.

For example, there are two compressed files in the server, both having a name of uc_browser.apk, then these two compressed files are corresponding two compressed files; in these two compressed files, furthermore, one compressed file has a version number of 9.6.0, and the other compressed file has a version number of 9.6.1, then it can be determined that the latter has a higher version number and is a new version file. Therefore, it can be determined that the compressed file with a version number of 9.6.0 is the old version compressed file, and the compressed file with a version number of 9.6.1 is a new version compressed file.

S12. The server acquires at least one of a first type sub-file, a second type sub-file, and a third type sub-file.

In the present embodiment, the first type sub-file is a file existing in a new version compressed file, but not in an old version compressed file; the second type sub-file is a file existing in both a new version compressed file and an old version compressed file, and both satisfy a preset decompression condition, the second type sub-file including a second type sub-file in a new version compressed file and a second type sub-file in an old version compressed file; the third type sub-file is a file existing in both a new version compressed file and an old version compressed file, and not satisfying, in part or wholly, the preset decompression condition, the third type sub-file including a third type sub-file in a new version compressed file and a third type sub-file in an old version compressed file.

The compressed file in the embodiments of the present application (including old version compressed files and new version compressed files) refers to a file obtained by storing a plurality of compressed sub-files according to a certain order. More specifically, the compressed file format may be zip format, and correspondingly, common files include files in the apk format, most game resource files, and data files of some large applications. However, they are not limited thereto. Those skilled in the art should understand that compressed files of other formats are similarly applicable for the solution of incremental upgrade according to the present application. With a new version compressed file as an example, data in the new version compressed file can be grouped according to functions and other factors, data in each group and/or sub-files are compressed, respectively, to obtain a plurality of compressed sub-files, these compressed sub-files are arranged according to a predetermined order to obtain a compressed file of the new version file, namely the new version compressed file.

In the present application, new version sub-file is used to represent a sub-file in the new version compressed file, and old version sub-file is used to represent a sub-file in the old version compressed file. For example, for a new version sub-file A, if there is no old version sub-file A' corresponding thereto, then said new version sub-file A is a first type sub-file.

In another example, for another new version sub-file B, if there is an old version sub-file B' corresponding thereto, and said new version sub-file B and the corresponding old version sub-file B' both satisfy a preset decompression condition, then said new version sub-file B is a second type sub-file in the new version compressed file, and said corresponding old version sub-file B' is a second type sub-file in the old version compressed file.

In another example, for yet another new version sub-file C, if there is an old version sub-file C' corresponding thereto, and said new version sub-file C and the corresponding old version sub-file C' do not satisfy, in part or wholly, the preset decompression condition (i.e. either said new version sub-file C does not satisfy the preset decompression condition, or the corresponding old version sub-file C' does not satisfy the preset decompression condition, or neither said new version sub-file C nor the corresponding old version sub-file C' satisfy the preset decompression condition), then said new version sub-file C is a third type sub-file in the new version compressed file, and said corresponding old version sub-file C' is a third type sub-file in the old version compressed file.

It should be noted that, if only first type sub-files are obtained after the above processing is completed, it indicates that the new version sub-files are all newly added files, rather than obtained by revising the old version sub-files. If only second type sub-files or third type sub-files are obtained after the above processing is completed, it indicates that the new version sub-files are all obtained by revising the corresponding old version sub-files. Similarly, if both second type sub-files and third type sub-files are obtained after the above processing is completed, it also indicates that the new version sub-files are all obtained by revising the corresponding old version sub-files. On the other hand, if the first type sub-files, the second type sub-files and the third type sub-files are obtained simultaneously, it indicates that the new version sub-files comprise both newly added files and files obtained by revising the corresponding old version sub-files.

A new version sub-file corresponding to an old version sub-file in the present embodiment refers to that said new version sub-file and said old version sub-file achieve the same (or similar) functions. In practical applications, corresponding sub-files have the same file name. As a result, a sub-file having the same file name as that of the new version sub-file may be searched in the old version compressed file, and the found sub-file is the old version sub-file corresponding to the new version sub-file.

According to commonly used method for incremental upgrade, the same way of difference comparison is used for all data or sub-files in a compressed file, so as to obtain a corresponding incremental file. However, it is found through research that different sub-files may probably have different corresponding optimal ways of difference comparison.

For example, some files have very small or no size difference before and after compression, and correspondingly, the size difference is not significant between two types of difference data obtained by using the decompression comparison method and the direct comparison method. Since the decompression comparison method requires implementation of the decompression operation for many times, the implementation efficiency is lower than that of the direct comparison method. As a result, the direct comparison method is a preferred difference comparison method for this type of files.

In another example, for a file with relatively great size difference before and after compression, the use of the decompression comparison method may need to sacrifice implementation efficiency to certain degree, but as the data granularity obtained after decompression is lower, and data in the old version sub-file and the new version sub-file having the same content but different sequences can be identified, which avoids the issue of the overall great difference in the files as a result of the change to the data arrangement sequence, the size of the obtained difference data is far smaller than the size of the difference data obtained by using the direct comparison method. As a result, the decompression comparison method is a preferred difference comparison method for this type of files.

In light of this, the above two types of files are differentiated according to a preset decompression condition in the embodiments of the present application, so as to facilitate the adoption of an optimal difference comparison method for each type of files.

S13. When the acquired file comprises a second type sub-file, the server decompresses the second type sub-file in the new version compressed file and the second type sub-file in the corresponding old version compressed file, and performs difference comparison to obtain a first difference data file.

Wherein, the first difference data file comprises the difference data obtained after the server decompresses the second type sub-file in the new version compressed file and the second type sub-file in the corresponding old version compressed file, and performs difference comparison. Namely, the first difference data file is a file generated with the obtained difference data.

S14. When the acquired file comprises a third type sub-file, the server directly performs difference comparison between the third type sub-file in the new version compressed file and the third type sub-file in the corresponding old version compressed file without decompression, to obtain a second difference data file.

Wherein, the second difference data file comprises the difference data obtained after the server directly performs difference comparison between the third type sub-file in the new version compressed file and the third type sub-file in the corresponding old version compressed file without decompression. Namely, the second difference data file is a file generated with the obtained difference data.

A set of the above first type sub-file, first difference data file and second difference data file is an incremental file that records the difference information between the old version compressed file and the new version compressed file; each first type sub-file, each first difference data file and each second difference data file is an incremental sub-file, respectively. It should be noted that, in practical use, files that may be obtained are a part, not all, of the above first type sub-file, first difference data file and second difference data file, and similarly, a set of said part of the files is an incremental file that records the difference information between the old version compressed file and the new version compressed file, for example, a set that only comprises a first type sub-file, a set that only comprises a first difference data file, and a set that only comprises a second difference data file; alternatively, a set that only comprises a first type sub-file and a first difference data file, a set that only comprises a first type sub-file and a second difference data file, and a set that only comprises a first difference data file and a second difference data file, and the like.

In the present embodiment, with respect to a first type sub-file, there is no first type sub-file in the old version compressed file, namely, with respect to the old version compressed file, the first type sub-file in the new version compressed file is a newly added file. As a result, with respect to the first type sub-file, there is no need to perform difference comparison, and said first type sub-file just needs to be treated as a sub-file of the incremental file.

In the present embodiment, with respect to a second type sub-file that satisfies a preset decompression condition, a way of difference comparison that decompresses first and then compares is used, which can reduce the size of a corresponding incremental sub-file, and then reduce the size of the incremental file; with respect to a second type sub-file that does not satisfy a preset decompression condition, a direct comparison method is used, which can shorten the time for difference comparison, improve the efficiency of incremental file generation, and then improve the efficiency of incremental upgrade.

In the embodiments of the present application, different difference comparison operations are performed on new version sub-files and old version sub-files of different types, to obtain difference data files for corresponding types, which can attain a goal of taking care of both the incremental file size and the upgrade efficiency at the same time.

S15. According to the acquired at least one of the first type sub-file, the first difference data file and the second difference data file, the server generates an incremental file for a client to perform incremental upgrade of the file.

Optionally, the server may compress all obtained incremental sub-files into one file. For example, it compresses the first type sub-file, the first difference data file and the second difference data file into one file to obtain an incremental file in the compressed file format so as to completely and accurately send/download said incremental file. Similarly, when only a part of the first type sub-file, the first difference data file and the second difference data file is obtained, it just compresses the obtained partial file into one file. Naturally, it is acceptable not to perform merging and compression, and each incremental sub-file exists independently. Namely, the incremental file comprises a plurality of individual files described above.

S16. A client acquires an incremental file from a server, wherein the incremental file comprises at least one of the above first type sub-file, first difference data file and second difference data file.

S17. The client performs a merging operation on the acquired incremental file and an old version compressed file stored by itself, according to the file types of sub-files in the acquired incremental file, to obtain a new version compressed file.

In the present embodiment, an example is that the incremental file simultaneously comprises the first type sub-file, the first difference data file and the second difference data file, the client may perform a merging operation in the following manner to obtain a new version compressed file: decompressing the second type sub-file in the old version compressed file, then merging with the first difference data file to obtain a first merged sub-file, and compressing the first merged sub-file to obtain a first compressed sub-file; merging the third type sub-file in the old version compressed file with the second difference data file to obtain a second merged sub-file, and compressing the second merged sub-file to obtain a second compressed sub-file; merging the first compressed sub-file, the second compressed sub-file, and the first type sub-file to obtain a new version compressed file.

Optionally, the client may set up a memory for a new version compressed file, and perform a merging operation in the following manner to obtain a new version compressed file: storing the above first type sub-file directly into said memory for a new version compressed file; decompressing the second type sub-file in the old version compressed file, then merging with the first difference data file, compressing the merged data to obtain a first compressed sub-file, and storing said first compressed sub-file into the memory for a new version compressed file; merging the third type sub-file in the old version compressed file with the second difference data file, compressing the merged data to obtain a second compressed sub-file, and storing said second compressed sub-file into the memory for a new version compressed file. When the merging operation is completed, the file set stored in the memory for a new version compressed file is a new version compressed file.

Referring to the above solution for acquiring a new version compressed file, then:

When the incremental file only comprises a first type sub-file, using the first type sub-file to obtain a new version compressed file. In this case, said first type sub-file may be used directly as a new version compressed file.

When the incremental file only comprises a first difference data file, decompressing the second type sub-file in the old version compressed file, then merging with the first difference data file to obtain a first merged sub-file, and compressing the first merged sub-file to obtain a first compressed sub-file; using the first compressed sub-file to obtain a new version compressed file. In this case, said first compressed sub-file may be used directly as a new version compressed file.

When the incremental file only comprises a second difference data file, merging the third type sub-file in the old version compressed file with the second difference data file to obtain a second merged sub-file, and compressing the second merged sub-file to obtain a second compressed sub-file; using the second compressed sub-file to obtain a new version compressed file. In this case, said second compressed sub-file may be used directly as a new version compressed file.

When the incremental file only comprises a first type sub-file and a first difference data file, decompressing the second type sub-file in the old version compressed file, then merging with the first difference data file to obtain a first merged sub-file, and compressing the first merged sub-file to obtain a first compressed sub-file; merging the first compressed sub-file and the first type sub-file to obtain a new version compressed file.

When the incremental file only comprises a first type sub-file and a second difference data file, merging the third type sub-file in the old version compressed file with the second difference data file to obtain a second merged sub-file, and compressing the second merged sub-file to obtain a second compressed sub-file; merging the second compressed sub-file and the first type sub-file to obtain a new version compressed file.

When the incremental file only comprises a first difference data file and a second difference data file, decompressing the second type sub-file in the old version compressed file, then merging with the first difference data file to obtain a first merged sub-file, and compressing the first merged sub-file to obtain a first compressed sub-file; merging the third type sub-file in the old version compressed file with the second difference data file to obtain a second merged sub-file, and compressing the second merged sub-file to obtain a second compressed sub-file; merging the first compressed sub-file and the second compressed sub-file to obtain a new version compressed file.

S18. The client uses the new version compressed file to perform incremental upgrade of a file.

It can be seen from the above technical solution that, with the method for incremental upgrade according to an embodiment of the present application, when a server generates an incremental file, it first acquires sub-files of different types in an old version compressed file and a new version compressed file, and then performs different difference comparison steps on the sub-files of different types, to obtain corresponding difference data files. Subsequently, the first type sub-file that exists in a new version compressed file, but not in an old version compressed file is used as newly added data, the direct comparison method with higher comparison efficiency is used on the third type sub-files that do not satisfy a preset decompression condition to obtain a corresponding second difference data file, and the decompression comparison method that results in relatively small difference data is used on the second sub-files that satisfy a preset decompression condition to obtain a corresponding first difference data file. Furthermore, according to the acquired at least one of the first type sub-file, the first difference data file and the second difference data file, the server generates an incremental file for a client to perform incremental upgrade of the file. Correspondingly, the client acquires, from the server, the above first type sub-file, first difference data file and second difference data file, decompresses the second type sub-file in the old version compressed file, merges with the first difference data file to obtain a first merged sub-file, and compresses the first merged sub-file to obtain a first compressed sub-file; merges the third type sub-file in the old version compressed file with the second difference data file to obtain a second merged sub-file, and compresses the second merged sub-file to obtain a second compressed sub-file; merges the first compressed sub-file, the second compressed sub-file, and the first type sub-file to obtain a new version compressed file. Therefore, the embodiment of the present application chooses a corresponding way of difference comparison and merging operation according to the type of sub-files in a compressed file, which can attain a goal of taking care of both the incremental file size and the upgrade efficiency at the same time for the entire incremental upgrade process.

Optionally, in the embodiments of the present application, the preset decompression condition may be that the size of a file before compression is greater than a preset byte value, and the compression ratio is smaller than a preset ratio, but is not limited thereto. In practical use, those skilled in the art may set up other appropriate decompression conditions by referring to said preset decompression condition so as to achieve the incremental upgrade solution according to the present application.

Wherein, the preset byte may be set to 100 KB, but is not limited thereto; the compression ratio is a ratio of the size of a file after compression to the size thereof before compression, which may be set to 70%, but is not limited thereto.

In a feasible embodiment of the present application, after the server carries out Steps S11 to S15 to obtain an incremental file between an old version compressed file and a new version compressed file, it may send an upgrade prompt message to a client associated therewith, upon receiving the upgrade prompt message, the client downloads the corresponding incremental file to achieve incremental upgrade of the old version compressed file stored by itself.

The above upgrade prompt message comprises version information of a new version compressed file corresponding to the incremental file; the version information at least comprises file name, version number, etc. Optionally, a client may unconditionally download the incremental file corresponding to each upgrade prompt message that it receives; alternatively, it may determine whether to upgrade a local file according to the version information in the received upgrade prompt message or the version information of the file stored or installed by itself. If upgrade is needed, it then downloads the incremental file corresponding to said upgrade prompt message, if upgrade is not needed or no corresponding old version file exists, it then does not download the incremental file corresponding to said upgrade prompt message.

For example, the version information carried in the upgrade prompt message received by the client is as follows: the file name is uc_browser.apk and the version number is 9.6.1; if a file with a name of uc_browser.apk does not exist in files stored or installed by the client itself, or there is a file with a name of uc_browser.apk and a version number of 9.6.1, it indicates that the client does not need to download the incremental file corresponding to said upgrade prompt message; if there is a file with a name of uc_browser.apk and a version number of 9.6.0 in files stored or installed by the client itself, i.e. the version number is lower than the version number of the new version compressed file corresponding to said upgrade prompt message, it indicates that it is necessary to upgrade the uc_browser.apk file in the client. At this moment, the client downloads the incremental file corresponding to said upgrade prompt message.

In another feasible embodiment of the present application, a client may proactively send a file upgrade request to a server, and upon receiving the file upgrade request, the server sends a corresponding incremental file to the client for the client to perform incremental upgrade of an old version compressed file stored by itself.

The file upgrade request comprises version information of a file stored or installed in the client. Upon receiving the file upgrade request from the client, the server searches if a corresponding incremental file exists, if yes, it sends said incremental file to the client. Optionally, if no incremental file corresponding to the file upgrade request exists in the server, the server may return a corresponding prompt message to the client, such as "No new version", "the current version is the latest version", etc.

For example, the version information carried in the file upgrade request received by the server is as follows: the file name is uc_browser.apk and the version number is 9.6.0. If the server finds that it stores an incremental file satisfying the following upgrade conditions: the old version compressed file and the new version compressed file corresponding to said incremental file both have a file name of uc_browser.apk, and the version number of the old version compressed file is 9.6.0, the version number of the new version compressed file is higher than 9.6.0 (e.g. 9.6.1 or 9.6.2), then the server sends said incremental file to the client. If none of the incremental files stored by the server satisfy the above upgrade condition (namely the file names of the old version compressed file/the new version compressed file corresponding to the incremental file are not uc_browser.apk, or the version number of the corresponding old version compressed file is not 9.6.0, or the version number of the corresponding new version compressed file is not higher than 9.6.0), it indicates that there is no uc_browser.apk file of a higher version. At this moment, the server may return a corresponding prompt message to the client.

In a feasible embodiment of the present application, after the classification of all new version sub-files in a new version compressed file is completed, i.e. the type of each new version sub-file is determined, a corresponding difference data file may then be generated according to the classification result.

Figure 2:
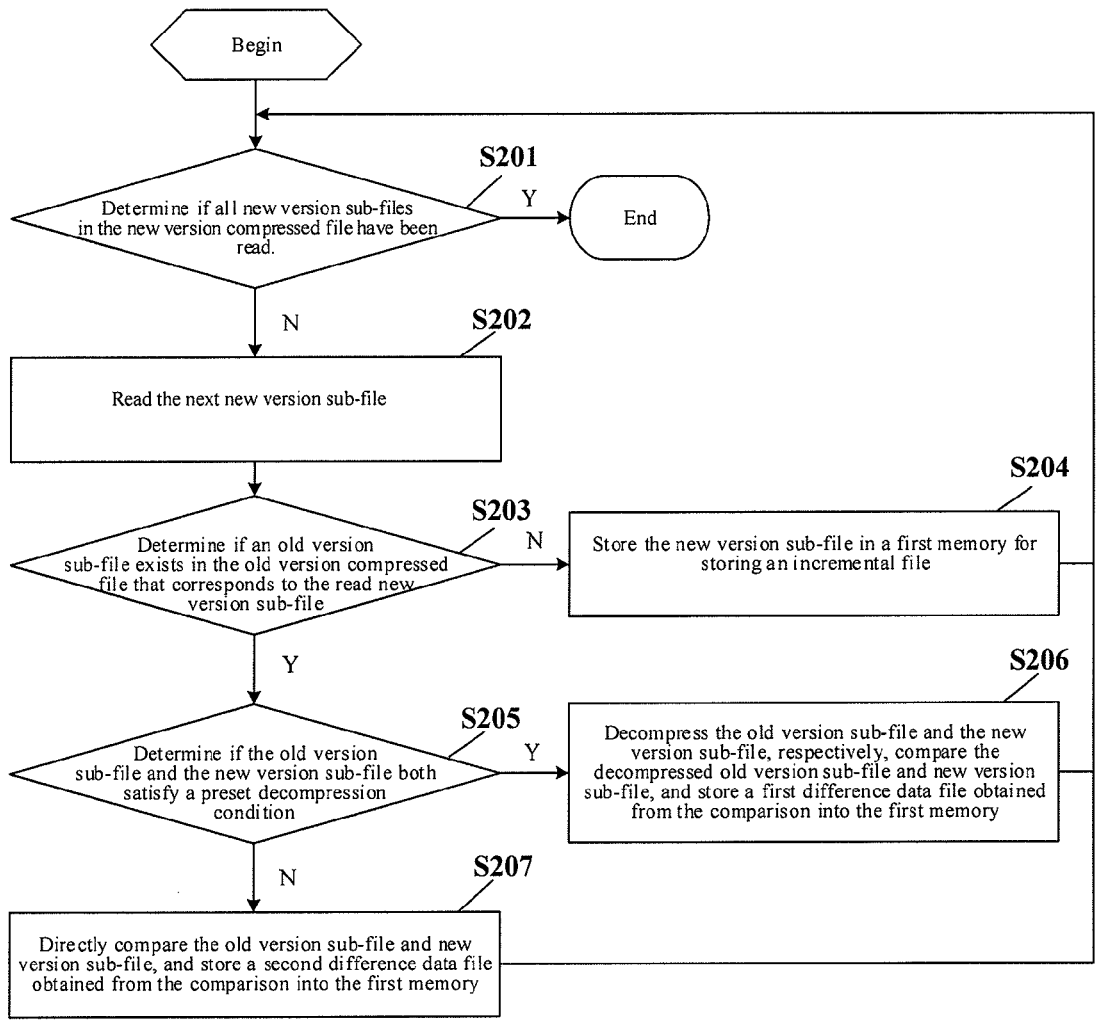
FIG. 2 is a flow chart of generating an incremental file in a method for incremental upgrade according to an embodiment of the present application.
Figure 3:
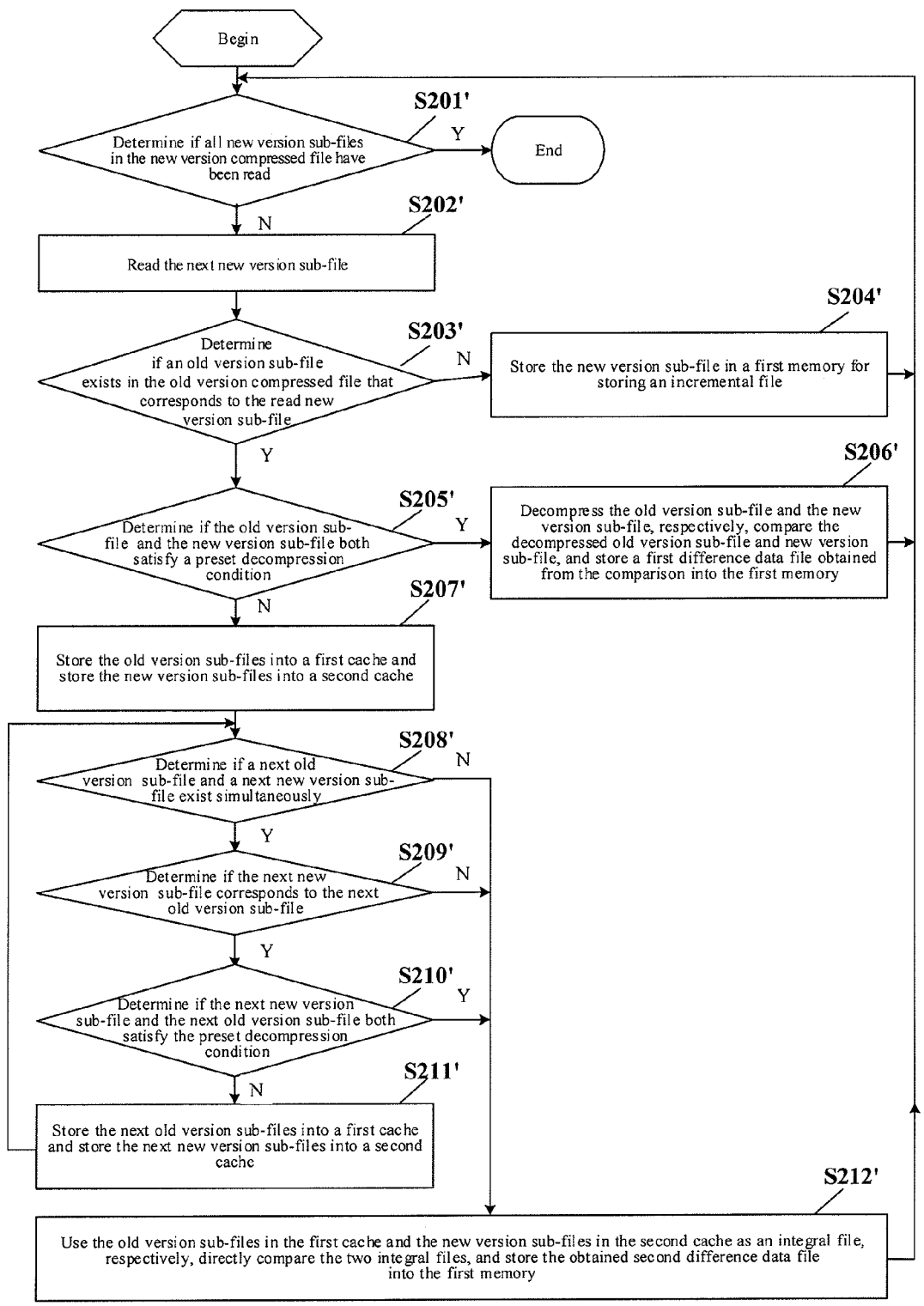
FIG. 3 is another flow chart of generating an incremental file in a method for incremental upgrade according to an embodiment of the present application.

In another feasible embodiment of the present application, after the type of a new version sub-file is determined, a corresponding operation is then immediately performed to generate a difference data file corresponding to said new version sub-file, as shown in FIG. 2 and FIG. 3. FIG. 2 and FIG. 3 are a flow chart of an embodiment, respectively, which is applied on a server to implement difference comparison between the old version compressed file and the new version compressed file to obtain a corresponding incremental file (i.e. the above Steps S12 to S15).

Referring to FIG. 2, in a feasible embodiment of the present application, the steps that a server generates a corresponding incremental file according to the acquired old version compressed file and new version compressed file are as follows:

S201. Determine if all new version sub-files in the new version compressed file have been read, if yes, end the flow, otherwise, go to Step S202.

S202. Read the next new version sub-file.

S203. Determine if an old version sub-file exists in the old version compressed file that corresponds to the read new version sub-file, if yes, go to Step S205, otherwise, go to Step S204.

S204. Store the new version sub-file in a first memory for storing an incremental file, and return to Step S201.

When there is no old version sub-file in the old version compressed file that corresponds to the read new version sub-file, it can be determined that said new version sub-file is a first type sub-file. Namely, relative to the old version compressed file, said new version sub-file is a newly added file, which may be directly written into the incremental file as an incremental sub-file.

S205. Determine if the old version sub-file and the new version sub-file both satisfy a preset decompression condition, if both satisfy the preset decompression condition, go to Step S206, otherwise, go to Step S207.

S206. Decompress the old version sub-file and the new version sub-file, respectively, compare the decompressed old version sub-file and new version sub-file, store a first difference data file obtained from the comparison into the above first memory, and return to Step S201.

The above first difference data file may be used as a sub-file of the incremental file. When the above old version sub-file and new version sub-file both satisfy the preset decompression condition, said old version sub-file and new version sub-file are the second type sub-files, when the decompression comparison method is used to perform difference comparison between the two, it can ensure that the obtained incremental sub-file is smaller than the incremental sub-file obtained with the direct comparison method, and as a result, the entire incremental file can be made relatively small.

In a practical application, when a new version sub-file is determined to be a second type sub-file, first, the file data header of the new version sub-file can be written into the first memory, and after a first difference data file is obtained after decompression and comparison steps, said first difference data file is then written into the first memory, and moreover, the memory addresses of file data headers of the above first difference data file and new version sub-file are continuous. In other words, the server writes the file data header of the second type sub-file in the new version compressed file into a memory; decompress the second type sub-file in the new version compressed file and the second type sub-file in the corresponding old version compressed file, and perform difference comparison to obtain a first difference data; writes the obtained first difference data to the memory address of the file data header of the second type sub-file in the memory, and then stores in the memory continuously with the second type sub-file; obtains a first difference data file according to the file data header of the second type sub-file and the first difference data in continuous storage.

S207. Directly compare the old version sub-file and new version sub-file, store a second difference data file obtained from the comparison into the first memory, and return to Step S201.

The above second difference data file may be used as a sub-file of the incremental file. When the old version sub-file does not satisfy the preset decompression condition, or the new version sub-file does not satisfy the preset decompression condition, or neither the old version sub-file nor the new version sub-file satisfies the preset decompression condition, said old version sub-file and new version sub-file are the third type sub-files, the above two methods (the decompression comparison method and the direct comparison method) are used to perform difference comparison between the old version sub-file and the new version sub-file, and the obtained incremental sub-files have close or identical size. As a result, the embodiment of the present application uses the direct comparison method to perform difference comparison between third type sub-files, which can shorten the time consumed by difference comparison, improve the efficiency of difference comparison, and then improve the efficiency of the entire incremental upgrade flow.

In any one loop, if the determination result of Step S201 is negative, namely all new version sub-files in the new version compressed file have been read, it indicates that the difference comparison between the old version compressed file and the new version compressed file has been completed, and the set of all data stored in the first memory is an incremental file that records the difference information between the old version compressed file and the new version compressed file.

In another feasible embodiment of the present application, with respect to third type sub-files, a second difference data may be further obtained using the following method:

Determine if the following preset condition is satisfied: a plurality of new version sub-files that are continuously stored (i.e. with continuous memory addresses) are all third type sub-files, and the old version sub-files corresponding, one to one, to the plurality of new version sub-files that are continuously stored also have continuous memory positions (i.e. memory addresses) in the old version compressed file. If the preset condition is satisfied, difference comparison is performed between an integral file formed by the above plurality of new version sub-files that are continuously stored and another integral file formed by the above plurality of old version sub-files that are continuously stored. In other words, the server determines that a plurality of third type sub-files with continuous memory addresses exist in the new version compressed file, and determines that a corresponding plurality of third type sub-files in the old version compressed file also have continuous memory addresses; uses the plurality of third type sub-files with continuous memory addresses in the new version compressed file as an integral file, and uses the plurality of third type sub-files with continuous memory addresses in the old version compressed file as another integral file; directly performs difference comparison between the two integral files without decompression, to obtain a second difference data file.

Specifically, refer to FIG. 3, in said embodiment, the steps that a server generates a corresponding incremental file according to the acquired old version compressed file and new version compressed file are as follows:

S201'. Determine if all new version sub-files in the new version compressed file have been read, if yes, end the flow, otherwise, go to Step S202'.

S202'. Read the next new version sub-file.

S203'. Determine if an old version sub-file exists in the old version compressed file that corresponds to the read new version sub-file, if yes, go to Step S205', otherwise, go to Step S204'.

S204'. Store the new version sub-file in a first memory for storing an incremental file, and return to Step S201'.

S205'. Determine if the old version sub-file and the new version sub-file both satisfy a preset decompression condition, if both satisfy the preset decompression condition, go to Step S206', otherwise, go to Step S207'.

S206'. Decompress the old version sub-file and the new version sub-file, respectively, compare the decompressed old version sub-file and new version sub-file, store a first difference data file obtained from the comparison into the above first memory, and return to Step S201'.

Unlike the flow shown in FIG. 2, when the determination result in Step S205' is negative, namely not all of the old version sub-files and new version sub-files satisfy the preset decompression condition, the following steps are carried out:

S207'. Store the old version sub-files into a first cache and at the same time, store the new version sub-files into a second cache.

FIG. 4 is a schematic diagram of a memory structure of an old version compressed file and a new version compressed file in the present embodiment, and FIG. 5 is a schematic diagram of a memory structure of a first cache and a second cache in the present embodiment. Referring to FIG. 4, assume that a new version sub-file file_21 with a memory address of B01 in the new version compressed file corresponds to an old version sub-file file_11 with a memory address of A01 in the old version compressed file, and neither of file_21 and file_11 satisfies the preset decompression condition, then store file_1 into a region with an address of C01 in the first cache, and store file_21 into a region with an address of D01 in the second cache, as shown in FIG. 5.

S208'. Determine if a next old version sub-file and a next new version sub-file exist simultaneously, and when a next old version sub-file and a next new version sub-file exist simultaneously, go to Step S209', otherwise, go to Step S212'.

The next old version sub-file refers to an old version sub-file in an old version compressed file that satisfies the following condition: the memory address is continuous with the memory address that the old version sub-file last stored into the first cache has in the old version compressed file; the next new version sub-file refers to a new version sub-file in a new version compressed file that satisfies the following condition: the memory address is continuous with the memory address that the new version sub-file last stored into the second cache has in the new version compressed file.

If there is no address that is continuous with the address A01, or there is no data at the address A02 that is continuous with the address A01, it is determined that a next old version sub-file with a memory address continuous with file_11 does not exist, and if an old version sub-file file_12 exists at the address A02, as shown in FIG. 5, it can be determined that a next old version sub-file file_12 with a memory address continuous with file_11 exists. Correspondingly, in FIG. 4, the memory address B02 of a new version sub-file file_22 is continuous with the memory address of file_21, namely the next new version sub-file is file_22. For the scenario shown in FIG. 4, therefore, it may continue to go to Step S209'.

S209'. Determine if the next new version sub-file corresponds to the next old version sub-file, if yes, go to Step S210', otherwise, go to Step S212'.

S210'. Determine if the next new version sub-file and the next old version sub-file both satisfy the preset decompression condition, if yes, go to Step S212', otherwise, go to Step S211'.

If the next new version sub-file and the next old version sub-file both satisfy the preset decompression condition, the two are both second type sub-files, otherwise, the two are both third type sub-files.

S211'. Store the next old version sub-files into a first cache and at the same time, store the next new version sub-files into a second cache, and return to S208'.

S212'. Use the old version sub-files in the first cache as an integral file, and the new version sub-files in the second cache as another integral file, directly compare the two integral files, store a second difference data file obtained from the comparison into the first memory, and return to Step S201'.

The above second difference data file is stored into the first memory similarly as a sub-file of the incremental file. When the difference comparison is completed, the set of all incremental sub-files stored in the first memory is an incremental file that records the difference information between the old version compressed file and the new version compressed file.

Still with FIG. 4 as an example, in S209', determine if file_12 corresponds to file_22. In the case where file_12 corresponds to file_22, go to Step S210', and determine if file_12 and file_22 both satisfy the preset decompression condition. If file_12 and file_22 both satisfy the preset decompression condition, it indicates that file_22 is a third type sub-file as well. Therefore, carry out Step S211' to store file_12 into a region with an address of C03 in the first cache, and store file_22 into a region with an address of D03 in the second cache, as shown in FIG. 5. Wherein, the memory addresses of file_11 and file_12 in the first cache are continuous, and the memory addresses of file_21 and file_22 in the first cache are continuous as well. On the contrary, if S208' determines that there is no next new version sub-file and/or next old version sub-file, or S209' determines that the next new version sub-file does not correspond to the next old version sub-file, or S210' determines that the next new version sub-file and the next old version sub-file both satisfy the preset decompression condition, it indicates that there is no next new version sub-file that satisfies the following condition: the next new version sub-file is a third type sub-file, and the old version sub-file corresponding to the next new version sub-file and the old version sub-file corresponding to the new version sub-file to be processed have continuous memory addresses in the old version compressed file. At this moment, carry out Step S212', use all old version sub-files in the first cache as an integral file, and all new version sub-files in the second cache as an integral file, perform difference comparison between the above two integral files using the direct comparison method, and then difference information between a plurality of new version sub-files and corresponding old version sub-files may be obtained.

For example, with respect to the scenario shown in FIG. 4, two new version sub-files file_21 and file_22 that are stored continuously are both third type sub-files, and the old version sub-file file_11 corresponding to file_21 and the old version sub-file file_12 corresponding to file_22 also have continuous memory addresses in the old version compressed file, which satisfies the above preset condition. According to the embodiment shown in FIG. 3, treat file_11 and file_12 as an integral file, treat file_21 and file_22 as an integral file, perform difference comparison once using the direct comparison method, and incremental sub-files corresponding to file_21 and file_22 can be obtained. According to the embodiment shown in FIG. 2, on the other hand, it is necessary to perform difference comparison twice (compare file_11 and file_21 for one time, and compare file_12 and file_22 for one time).

It can be seen that, by cyclically carrying out Steps S208' to S211', sub-files that satisfy the following preset conditions can be identified: a plurality of new version sub-files that are continuously stored are all third type sub-files, old version sub-files corresponding, one to one, to the plurality of new version sub-files that are continuously stored exist in the old version compressed file, and said plurality of old version sub-files also have continuous memory positions in the old version compressed file; furthermore, the plurality of new version sub-files that are continuously stored are used as an integral file, and the corresponding plurality of old version sub-files are used as another integral file, difference comparison is performed once between the above two integral files using the direct comparison method, and then a second difference data file corresponding to the plurality of third type sub-files that are continuously stored maybe obtained. As a result, the embodiment shown in FIG. 3 can reduce the times of implementation of difference comparison, and further shorten the time required to generate an incremental file and improve the upgrade efficiency.

In the above embodiment, in the phase of implementing difference comparison and generating an incremental file, the server performs classification processing on sub-files in the old version compressed file and the new version compressed file, uses different difference comparison methods on sub-files of different types to obtain corresponding difference data files, and attains a goal of taking care of both the incremental file size and the upgrade efficiency at the same time.

Figure 6:
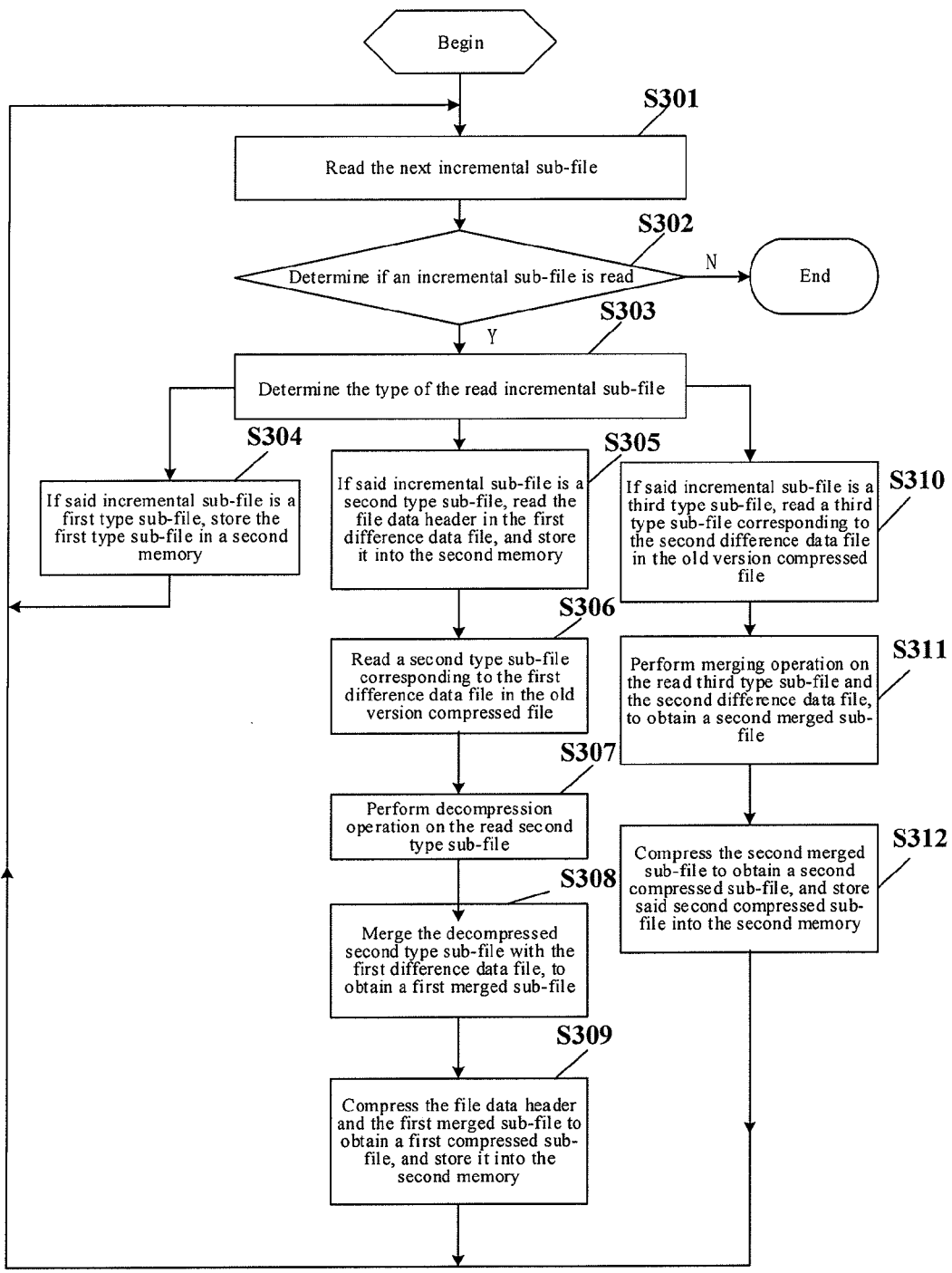
FIG. 6 is a flow chart of a client carrying out a merging operation in the method for incremental upgrade according to an embodiment of the present application.

In a feasible embodiment of the present application, as shown in FIG. 6, the flow in which a client carries out a merging operation according to data types in an incremental file is as follows:

S301. Read the next incremental sub-file.

The above incremental sub-file is a sub-file of the incremental file, the incremental sub-file comprising at least one of the above first type sub-file, first difference data file and second difference data file.

S302. Determine if an incremental sub-file is read, if yes, go to Step S303, otherwise, end the flow.

S303. Determine the type of the read incremental sub-file, and choose to go to Step S304, S305 or S310 according to the determination result.

S304. If said incremental sub-file is a first type sub-file, store the first type sub-file in a second memory, and return to Step S301.

Wherein, the above second memory is a memory in a client for storing a new version compressed file.

S305. If said incremental sub-file is a first difference data file, read the file data header in the first difference data file, and store said file data header into the second memory.

S306. Read a second type sub-file corresponding to the first difference data file in the old version compressed file.

S307. Perform decompression operation on the read second type sub-file.

S308. Merge the decompressed second type sub-file with the first difference data file, to obtain a first merged sub-file.

S309. Compress the above file data header and first merged sub-file to obtain a first compressed sub-file, store said first compressed sub-file into the second memory, and return to Step S301.

S310. If said incremental sub-file is a second difference data file, read a third type sub-file corresponding to the second difference data file in the old version compressed file.

S311. Perform merging operation on the read third type sub-file and the second difference data file, to obtain a second merged sub-file.

S312. Compress the above second merged sub-file to obtain a second compressed sub-file, store said second compressed sub-file into the second memory, and return to Step S301.

When the flow described above ends, namely the merging operation is completed, the set of files stored in the second memory of the client is a target file of this incremental upgrade, i.e. a new version compressed file corresponding to the old version compressed file stored at the client.

It can be seen from the above technical solution that, in the phase of generating an incremental file, the embodiments of the present application classify sub-files in the old version compressed file and the new version compressed file through a server, then obtain corresponding difference data files by using different difference comparison methods on sub-files of different types, and attain a goal of taking care of both the incremental file size and the upgrade efficiency at the same time. Moreover, when the client performs merging operations on the incremental file and the old version compressed file, different merging methods are used according to the types of sub-files of the incremental file, which can further improve the incremental upgrade efficiency.

In an example that a browser used in Android systems, uc_browser, is upgraded from Version 9.6.0 to Version 9.6.1, if a conventional direct comparison method is used to compare two versions of compressed files in the apk format as an integral part, respectively, the size of the obtained incremental file is 9410 KB. If a conventional decompression comparison method is used to completely decompress two versions of the compressed files in the apk format and then compare, the size of the obtained incremental file is 937 KB. Throughout the entire process of generating an incremental file, more than 6000 times of decompression operation (the compressed file of each version comprises more than 3000 sub-files) and more than 3000 times of compression operation (one time of individual compression operation is performed on each obtained incremental sub-file) need to be carried out. In the process that the client carries out a merging operation on the incremental file and the Version 9.6.0 compressed file, in the meantime, more than 6000 times of decompression operation (once performed on each of more than 3000 incremental sub-files and more than 3000 sub-files in the Version 9.6.0 compressed file) and more than 3000 times of compression operation (one time of individual compression operation is performed on each sub-file obtained from the merge) also need to be carried out.

If the method for incremental upgrade according to the embodiments of the present application is used, there 8 sub-files in the Version 9.6.1 compressed file that are second type sub-files after classification, which need to be decompressed and then compared, consequently only 16 times of decompression operation (8 times for each of the two versions of the compressed file) and 1 time of compression operation (to compress all incremental sub-files into one incremental file) need to be carried out, and the incremental file has a size of 881 KB. Correspondingly, in the process that the client carries out a merging operation, only 9 times of decompression operation (decompression performed once on the incremental file, and 8 times on the Version 9.6.0 compressed file) and 8 times of compression operation (performed once on 8 sub-files obtained in a manner of decompression first and merging later) need to be carried out.

It can be seen from the above comparison of examples that, relative to the conventional method to achieve incremental upgrade with the direct comparison method, the embodiments of the present application can reduce the size of incremental files; relative to the conventional method to achieve incremental upgrade with the decompression comparison method, the embodiments of the present application can lower the operation complexity and improve the upgrade efficiency.

Figure 7:
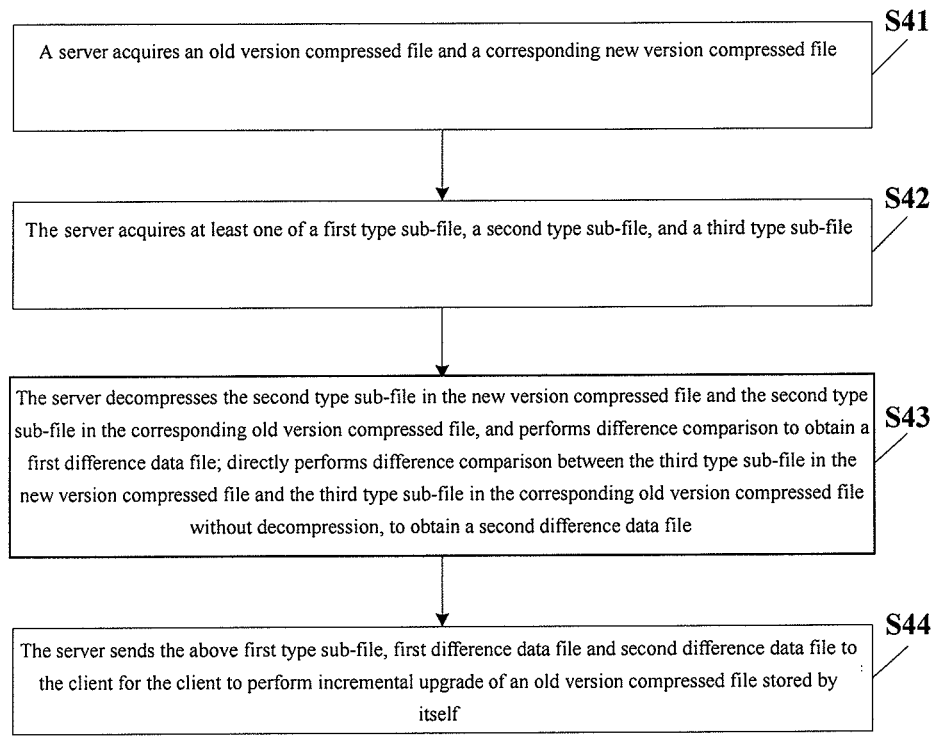
FIG. 7 is a flow chart of another method for incremental upgrade according to an embodiment of the present application.

Referring to FIG. 7, an embodiment of the present application provides another method for incremental upgrade, comprising the following steps:

S41. The server acquires an old version compressed file and a corresponding new version compressed file.

Optionally, an embodiment of the present application may determine corresponding two compressed files according to file names and/or version identifiers, and then, according to version numbers of the two compressed files, determine which compressed file is the old version compressed file, and which compressed file is the new version compressed file.

S42. The server acquires at least one of a first type sub-file, a second type sub-file, and a third type sub-file.

Wherein, the first type sub-file is a file existing in a new version compressed file, but not in an old version compressed file; the second type sub-file is a file existing in both a new version compressed file and an old version compressed file, and both satisfying a preset decompression condition, including a second type sub-file in a new version compressed file and a second type sub-file in an old version compressed file; the third type sub-file is a file existing in both a new version compressed file and an old version compressed file, and not satisfying, in part or wholly, the preset decompression condition, including a third type sub-file in a new version compressed file and a third type sub-file in an old version compressed file.

S43. The server decompresses the second type sub-file in the new version compressed file and the second type sub-file in the corresponding old version compressed file, and performs difference comparison to obtain a first difference data file; directly performs difference comparison between the third type sub-file in the new version compressed file and the third type sub-file in the corresponding old version compressed file without decompression, to obtain a second difference data file.

In the embodiment of the present application, there is no first type sub-file in the old version compressed file, namely, with respect to the old version compressed file, the first type sub-file in the new version compressed file is a newly added file. As a result, with respect to the first type sub-file, there is no need to perform difference comparison, and said first type sub-file just needs to be treated as a sub-file of the incremental file.

A set of the above first type sub-file, first difference data file and second difference data file is an incremental file that records the difference information between the old version compressed file and the new version compressed file.

S44. The server sends the above first type sub-file, first difference data file and second difference data file to the client for the client to perform incremental upgrade of an old version compressed file stored by itself.

In the embodiments of the present application, upon receiving the above first type sub-file, first difference data file and second difference data file, the client may obtain a new version compressed file in the following manner: decompressing the second type sub-file in the old version compressed file, then merging with the first difference data file to obtain a first merged sub-file, and compressing the first merged sub-file to obtain a first compressed sub-file; merging the third type sub-file in the old version compressed file with the second difference data file to obtain a second merged sub-file, and compressing the second merged sub-file to obtain a second compressed sub-file; merging the first compressed sub-file, the second compressed sub-file and the first type sub-file to obtain a new version compressed file.

Optionally, in the embodiments of the present application, the preset decompression condition may be that the size of a file before compression is greater than a preset byte value and the compression ratio is smaller than a preset ratio, but is not limited thereto. The compression ratio is a ratio of the size of a file after compression to the size thereof before compression.

In a feasible embodiment of the present application, when the sever completes Steps S41 to S43 and obtains an incremental file (including the first type sub-file, the first difference data file and the second difference data file) between an old version compressed file and a new version compressed file, it may send an upgrade prompt message to a client associated therewith, upon receiving the upgrade prompt message, the client downloads the corresponding incremental file to achieve incremental upgrade of the old version compressed file stored by itself.

In another feasible embodiment of the present application, upon receiving a file upgrade request from a client, the server sends a corresponding incremental file to the client for the client to perform incremental upgrade of an old version compressed file stored by itself.

It can be seen from the above technical solution that, with the method for incremental upgrade according to an embodiment of the present application, in the phase of implementing difference comparison and generating an incremental file, the server performs classification processing on sub-files in the old version compressed file and the new version compressed file, uses different difference comparison methods on sub-files of different types to obtain difference data files for corresponding types, further obtains incremental files having a variety of types of sub-files, and attains a goal of taking care of both the incremental file size and the upgrade efficiency at the same time. Moreover, the server sends the obtained incremental files to the client, such that the client can use different merging methods according to the types of sub-files of the incremental file, which can further improve the incremental upgrade efficiency.

Figure 8:
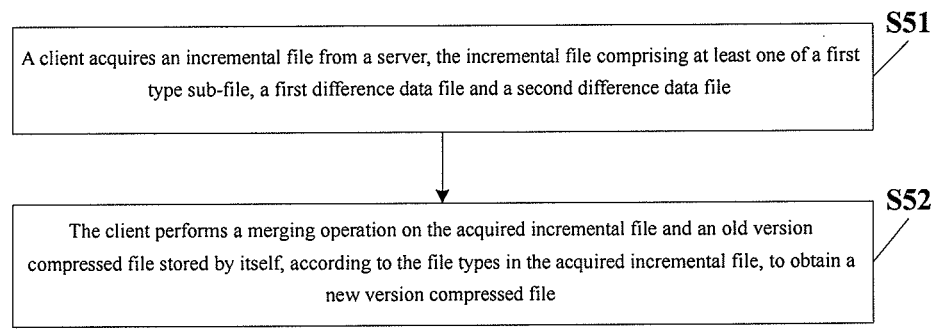
FIG. 8 is a flow chart of yet another method for incremental upgrade according to an embodiment of the present application.

As shown in FIG. 8, an embodiment of the present application further provides a method for incremental upgrade, comprising the following steps:

S51. A client acquires an incremental file from a server, the incremental file comprising at least one of a first type sub-file, a first difference data file and a second difference data file.

Wherein, the first type sub-file is a file existing in a new version compressed file, but not in an old version compressed file; the second type sub-file is a file obtained by the server decompressing and performing difference comparison on files existing in both a new version compressed file and an old version compressed file, and both satisfy a preset decompression condition; the second difference data file is data obtained by the server directly performing difference comparison on files existing in both a new version compressed file and an old version compressed file, and not satisfying, in part or wholly, the preset decompression condition without decompression. Namely, the first type sub-file is a file existing in a new version compressed file, but not in an old version compressed file; the first difference data file is a file obtained by decompressing the second type sub-file in the new version compressed file and the second type sub-file in the corresponding old version compressed file, and performing difference comparison, wherein the second type sub-file is a file existing in both a new version compressed file and an old version compressed file, and both satisfy a preset decompression condition; the second difference data file is a file obtained by directly performing difference comparison between the third type sub-file in the new version compressed file and the third type sub-file in the corresponding old version compressed file without decompression, wherein the third type sub-file is a file existing in both a new version compressed file and an old version compressed file, and not satisfying, in part or wholly, the preset decompression condition.

S52. The client performs a merging operation on the acquired incremental file and an old version compressed file stored by itself, according to the file types in the acquired incremental file, to obtain a new version compressed file.

In the embodiments of the present application, the incremental file comprising a first type sub-file, a first difference data file and a second difference data file, the client performs a merging operation in the following manner to obtain a new version compressed file: decompressing the second type sub-file in the old version compressed file, then merging with the first difference data file to obtain a first merged sub-file, and compressing the first merged sub-file to obtain a first compressed sub-file; merging the third type sub-file in the old version compressed file with the second difference data file to obtain a second merged sub-file, and compressing the second merged sub-file to obtain a second compressed sub-file; merging the first compressed sub-file, the second compressed sub-file and the first type sub-file to obtain a new version compressed file.

Optionally, in the embodiments of the present application, the preset decompression condition may be that the size of a file before compression is greater than a preset byte value and the compression ratio is smaller than a preset ratio, but is not limited thereto. The compression ratio is a ratio of the size of a file after compression to the size thereof before compression.

Optionally, in the above incremental upgrade method, the decompressing the second type sub-file in the old version compressed file, then merging with the first difference data file to obtain a first merged sub-file, and compressing the first merged sub-file to obtain a first compressed sub-file comprises the following steps:

the client reads and stores the file data header of the first difference data file;

reads the second type sub-file in the old version compressed file corresponding to the first difference data file;

decompresses the read second type sub-file;

merges the decompressed second type sub-file with the first difference data file to obtain a first merged sub-file;

compresses the file data header and the first merged sub-file to obtain the first compressed sub-file.

Figure 9:
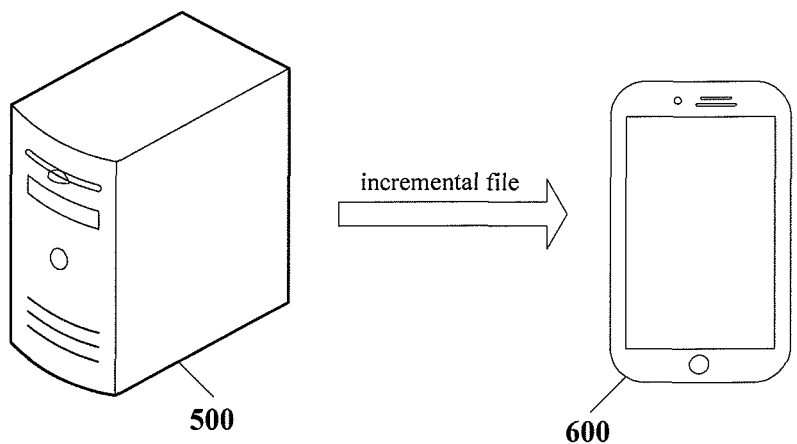
FIG. 9 is a schematic diagram of the relationship between a server and a client for implementing incremental upgrade according to an embodiment of the present application.

Corresponding to the above method embodiments of the present application, the embodiments of the present application further provide a server 500 and a client 600, respectively. As shown in FIG. 9, the server 500 is configured to generate an incremental file of a new version compressed file relative to an old version compressed file, the client 600 acquires said incremental file and carries out incremental upgrade of the local old version compressed file. Wherein, the client 600 acquiring said incremental file may be that the client 600 sends a file upgrade request to the server 500, such that the server 500 feeds back a corresponding incremental file; or may be that the server 500, after generating an incremental file, actively sends an upgrade prompt message to the client 600 to remind the client 600 to download said incremental file and achieve upgrade of the local file.

Figure 10:
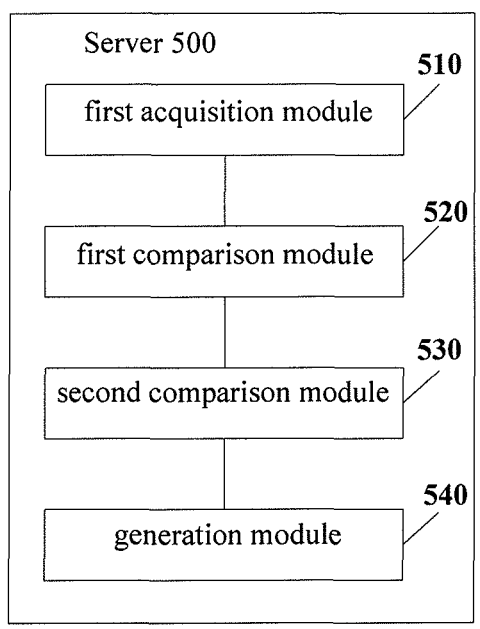
FIG. 10 is a structural block diagram of a server according to an embodiment of the present application.

As shown in FIG. 10, the server 500 according to a feasible embodiment of the present application mainly comprises: a first acquisition module 510, a first comparison module 520, a second comparison module 530, and a generation module 540.

Wherein, the first acquisition module 510 is configured to acquire at least one of a first type sub-file, a second type sub-file, and a third type sub-file; wherein the first type sub-file is a file existing in a new version compressed file, but not in an old version compressed file; the second type sub-file is a file existing in both a new version compressed file and an old version compressed file, and both satisfy a preset decompression condition, including a second type sub-file in a new version compressed file and a second type sub-file in an old version compressed file; the third type sub-file is a file existing in both a new version compressed file and an old version compressed file, and not satisfying, in part or wholly, the preset decompression condition, including a third type sub-file in a new version compressed file and a third type sub-file in an old version compressed file.

Optionally, the preset decompression condition may be that the size of a file before compression is greater than a preset byte value and the compression ratio is smaller than a preset ratio, but is not limited thereto. The compression ratio is a ratio of the size of a file after compression to the size thereof before compression.

The first comparison module 520 is configured to, when the acquired file comprises a second type sub-file, decompress the second type sub-file in the new version compressed file and the second type sub-file in the corresponding old version compressed file, and perform difference comparison to obtain a first difference data file.

The second comparison module 530 is configured to, when the acquired file comprises a third type sub-file, directly perform difference comparison between the third type sub-file in the new version compressed file and the third type sub-file in the corresponding old version compressed file without decompression, to obtain a second difference data file.

The generation module 540 is configured to, according to the acquired at least one of the first type sub-file, the first difference data file and the second difference data file, generate an incremental file for a client to perform incremental upgrade of the file.

In the embodiments of the present application, with respect to the client, upon receiving the first type sub-file, the first difference data file and the second difference data file, the client may obtain a new version compressed file in the following manner: decompressing the second type sub-file in the old version compressed file, then merging with the first difference data file to obtain a first merged sub-file, and compressing the first merged sub-file to obtain a first compressed sub-file; merging the third type sub-file in the old version compressed file with the second difference data file to obtain a second merged sub-file, and compressing the second merged sub-file to obtain a second compressed sub-file; merging the first compressed sub-file, the second compressed sub-file and the first type sub-file to obtain a new version compressed file.

Figure 11:
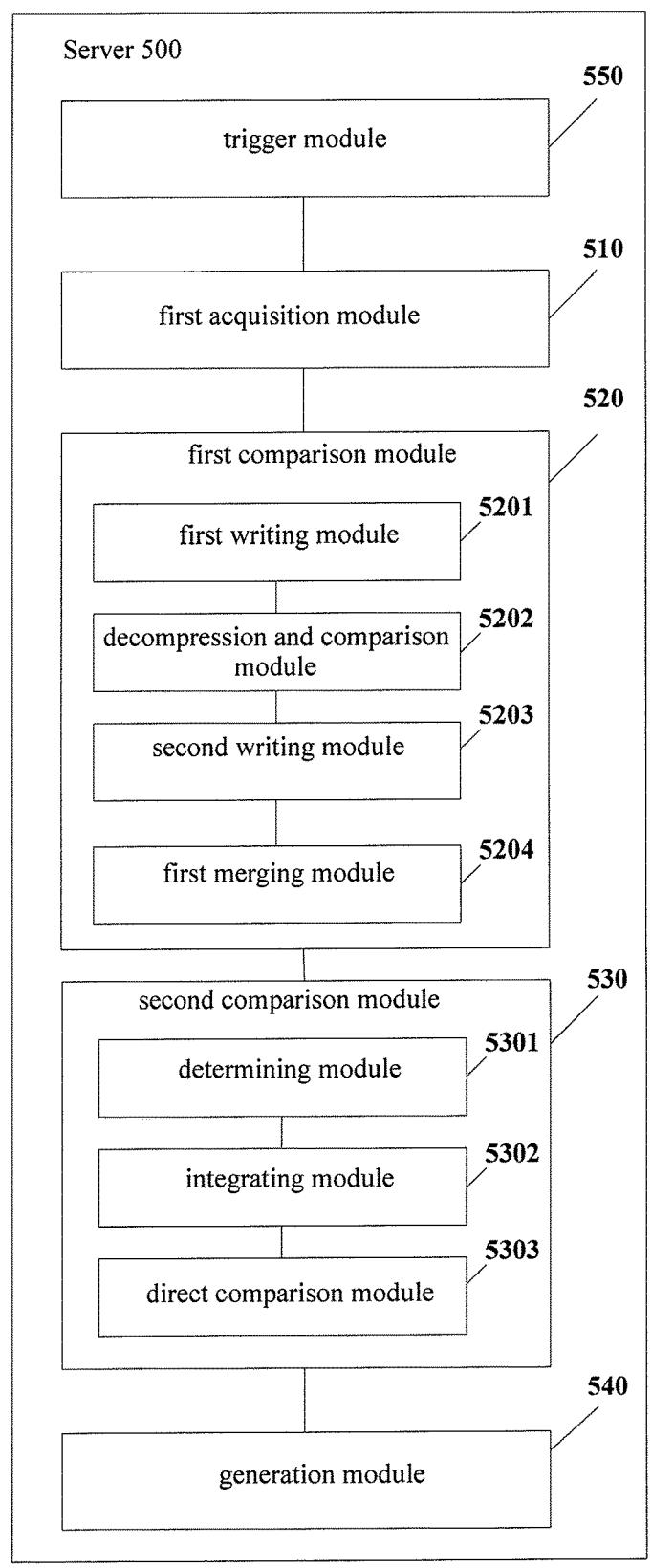
FIG. 11 is a structural block diagram of an optimized server according to an embodiment of the present application.

Preferably, a server after the server 500 shown in FIG. 10 is optimized is shown in FIG. 11.

In the optimized server 500:

Preferably, the first comparison module 520 comprises: a first writing module 5201, configured to write the file data header of the second type sub-file in the new version compressed file into a memory; a decompression and comparison module 5202, configured to decompress the second type sub-file in the new version compressed file and the second type sub-file in the corresponding old version compressed file, and perform difference comparison to obtain a first difference data; a second writing module 5203, configured to store, after the obtained first difference data is written to the memory address of the file data header of the second type sub-file in the memory, in the memory continuously with the second type sub-file; and a first merging module 5204, configured to obtain a first difference data file according to the file data header of the second type sub-file and the first difference data in continuous storage.

Preferably, the second comparison module 530 comprises: a determining module 5301, configured to determine that a plurality of third type sub-files with continuous memory addresses exist in the new version compressed file, and determine that a corresponding plurality of third type sub-files in the old version compressed file also have continuous memory addresses; an integrating module 5302, configured to use the plurality of third type sub-files with continuous memory addresses in the new version compressed file as an integral file, and use the plurality of third type sub-files with continuous memory addresses in the old version compressed file as another integral file; a direct comparison module 5303, configured to directly perform difference comparison between the two integral files without decompression, to obtain a second difference data file.

Preferably, the server 500 in the present embodiment further comprises: a trigger module 550, configured to, before the first acquisition module 510 acquires at least one of a first type sub-file, a second type sub-file, and a third type sub-file in the new version compressed file, and at least one of a first type sub-file, a second type sub-file, and a third type sub-file in the old version compressed file, receive a file upgrade request sent from the client; and upon receiving the file upgrade request, trigger the first acquisition module to execute.

It can be seen from the above technical solution that, in the phase of implementing difference comparison and generating an incremental file, the server according to an embodiment of the present application performs classification processing on sub-files in the old version compressed file and the new version compressed file, uses different difference comparison methods on sub-files of different types to obtain difference data files for corresponding types, further obtains incremental files having a variety of types of sub-files, and attains a goal of taking care of both the incremental file size and the upgrade efficiency at the same time. Moreover, the server sends the obtained incremental files to the client, such that the client can use different merging methods according to the types of sub-files of the incremental file, which can further improve the incremental upgrade efficiency.

Figure 12:
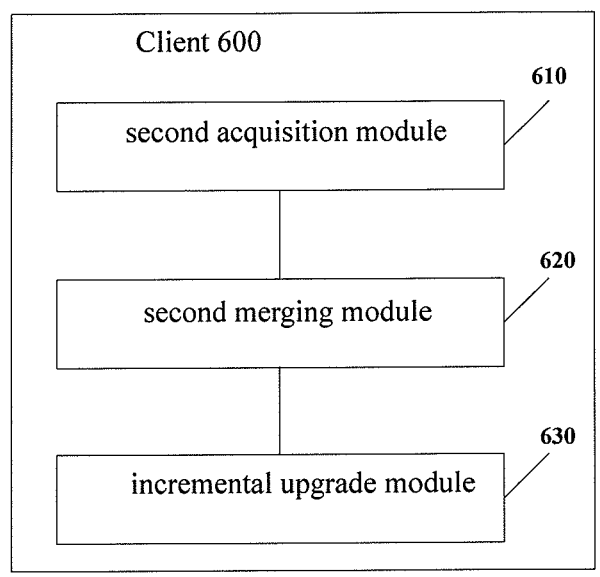
FIG. 12 is a structural block diagram of a client according to an embodiment of the present application.

As shown in FIG. 12, the client 600 according to a feasible embodiment of the present application comprises: a second acquisition module 610, a second merging module 620, and an incremental upgrade module 630.

The second acquisition module 610 is configured to acquire an incremental file from a server, wherein the incremental file comprises at least one of a first type sub-file, a first difference data file and a second difference data file.

Wherein, the first type sub-file is a file existing in a new version compressed file, but not in an old version compressed file; the first difference data file is a file obtained by decompressing the second type sub-file in the new version compressed file and the second type sub-file in the corresponding old version compressed file, and performing difference comparison, the second type sub-file being a file existing in both a new version compressed file and an old version compressed file, and both satisfy a preset decompression condition; the second difference data file is a file obtained by directly performing difference comparison between the third type sub-file in the new version compressed file and the third type sub-file in the corresponding old version compressed file without decompression, the third type sub-file being a file existing in both a new version compressed file and an old version compressed file, and not satisfying, in part or wholly, the preset decompression condition.

The second merging module 620 is configured to use the incremental file to obtain a new version compressed file. The second merging module 620 may perform a merging operation on the acquired incremental file and an old version compressed file stored by itself, according to the file types in the acquired incremental file, to obtain a new version compressed file.

In the embodiments of the present application, when the incremental file comprises a first type sub-file, a first difference data file and a second difference data file, the second merging module 620 performs a merging operation in the following manner to obtain a new version compressed file: decompressing the second type sub-file in the old version compressed file, then merging with the first difference data file to obtain a first merged sub-file, and compressing the first merged sub-file to obtain a first compressed sub-file; merging the third type sub-file in the old version compressed file with the second difference data file to obtain a second merged sub-file, and compressing the second merged sub-file to obtain a second compressed sub-file; merging the first compressed sub-file, the second compressed sub-file, and the first type sub-file to obtain a new version compressed file.

The incremental upgrade module 630 is configured to use the new version compressed file to perform incremental upgrade of a file.

Optionally, in the embodiments of the present application, the preset decompression condition may be that the size of a file before compression is greater than a preset byte value and the compression ratio is smaller than a preset ratio, but is not limited thereto. The compression ratio is a ratio of the size of a file after compression to the size thereof before compression.

Preferably, in a client after the client 600 shown in FIG. 12 is optimized:

The second merging module 620 using the incremental file to obtain a new version compressed file further comprises:

when the incremental file only comprises a first type sub-file, using the first type sub-file to obtain a new version compressed file;

when the incremental file only comprises a first difference data file, decompressing the second type sub-file in the old version compressed file, then merging with the first difference data file to obtain a first merged sub-file, and compressing the first merged sub-file to obtain a first compressed sub-file; using the first compressed sub-file to obtain a new version compressed file;

when the incremental file only comprises a second difference data file, merging the third type sub-file in the old version compressed file with the second difference data file to obtain a second merged sub-file, and compressing the second merged sub-file to obtain a second compressed sub-file; using the second compressed sub-file to obtain a new version compressed file;

when the incremental file only comprises a first type sub-file and a first difference data file, decompressing the second type sub-file in the old version compressed file, then merging with the first difference data file to obtain a first merged sub-file, and compressing the first merged sub-file to obtain a first compressed sub-file; merging the first compressed sub-file and the first type sub-file to obtain a new version compressed file;

when the incremental file only comprises a first type sub-file and a second difference data file, merging the third type sub-file in the old version compressed file with the second difference data file to obtain a second merged sub-file, and compressing the second merged sub-file to obtain a second compressed sub-file; merging the second compressed sub-file and the first type sub-file to obtain a new version compressed file;

when the incremental file only comprises a first difference data file and a second difference data file, decompressing the second type sub-file in the old version compressed file, then merging with the first difference data file to obtain a first merged sub-file, and compressing the first merged sub-file to obtain a first compressed sub-file; merging the third type sub-file in the old version compressed file with the second difference data file to obtain a second merged sub-file, and compressing the second merged sub-file to obtain a second compressed sub-file; merging the first compressed sub-file and the second compressed sub-file to obtain a new version compressed file.

Preferably, the second merging module 620 decompressing the second type sub-file in the old version compressed file, then merging with the first difference data file to obtain a first merged sub-file, and compressing the first merged sub-file to obtain a first compressed sub-file comprises: reading and storing the file data header of the first difference data file; reading the second type sub-file in the old version compressed file corresponding to the first difference data file; decompressing the read second type sub-file; merging the decompressed second type sub-file with the first difference data file to obtain a first merged sub-file; compressing the file data header and the first merged sub-file to obtain the first compressed sub-file.

With respect to the devices in the above embodiments, specific ways in which each module carries out operations have been described in detail in the embodiments regarding the method and will not be described in detail herein.

Moreover, the method according to the present application may further be implemented in a computer program executed by a CPU, and when the computer program is executed by a CPU, the above functions defined in the method according to the present application will be implemented.

In addition, an embodiment of the present application further provides a computer readable medium comprising processor-executable program codes, wherein the program codes cause a processor to carry out the following steps:

acquiring an old version compressed file and a corresponding new version compressed file;

acquiring at least one of a first type sub-file, a second type sub-file, and a third type sub-file; wherein the first type sub-file is a file existing in a new version compressed file, but not in an old version compressed file; the second type sub-file is a file existing in both a new version compressed file and an old version compressed file, and both satisfy a preset decompression condition, including a second type sub-file in a new version compressed file and a second type sub-file in an old version compressed file; the third type sub-file is a file existing in both a new version compressed file and an old version compressed file, and not satisfying, in part or wholly, the preset decompression condition, including a third type sub-file in a new version compressed file and a third type sub-file in an old version compressed file;

when the acquired file comprises a second type sub-file, decompressing the second type sub-file in the new version compressed file and the second type sub-file in the corresponding old version compressed file, and performing difference comparison to obtain a first difference data file; when the acquired file comprises a third type sub-file, directly performing difference comparison between the third type sub-file in the new version compressed file and the third type sub-file in the corresponding old version compressed file without decompression, to obtain a second difference data file;

sending the first type sub-file, the first difference data file and the second difference data file to a client for the client to perform incremental upgrade of an old version compressed file stored by itself.

Optionally, the preset decompression condition comprises: the size of a file before compression is greater than a preset byte value, and the compression ratio is smaller than a preset ratio; the compression ratio is a ratio of the size of a file after compression to the size thereof before compression.

Figure 13:
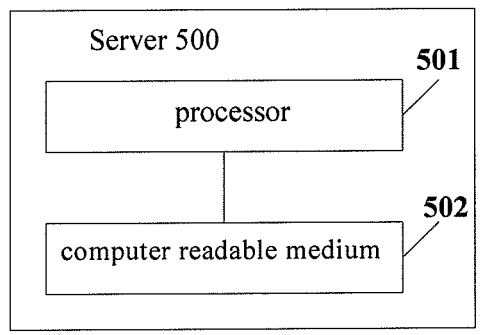
FIG. 13 is a structural block diagram of another server according to an embodiment of the present application.

The above computer readable medium may be applied on a server. As shown in FIG. 13, the server 500 according to a feasible embodiment of the present application comprises a processor 501 and the above computer readable medium 502, when a new version compressed file of an old version compressed file (e.g. a game's resource file, a program's installation file, etc.) exists in the server 500, the processor 501 may execute the program codes in the computer readable medium 502 to implement difference comparison between the new version compressed file and the old version compressed file to obtain a corresponding incremental file, and relative to a conventional device that implements difference comparison by using the direct comparison method and the decompression comparison method, it can ensure that the obtained incremental file is relatively small, and also ensure that the efficiency of difference comparison is relatively high.

In addition, an embodiment of the present application further provides a computer readable medium comprising processor-executable program codes, wherein the program codes cause a processor to carry out the following steps:

acquiring an incremental file from a server, wherein the incremental file comprises at least one of a first type sub-file, a first difference data file and a second difference data file; wherein the first type sub-file is a file existing in a new version compressed file, but not in an old version compressed file; the first difference data file is a file obtained by decompressing the second type sub-file in the new version compressed file and the second type sub-file in the corresponding old version compressed file, and performing difference comparison, the second type sub-file being a file existing in both a new version compressed file and an old version compressed file, and both satisfy a preset decompression condition; the second difference data file is a file obtained by directly performing difference comparison between the third type sub-file in the new version compressed file and the third type sub-file in the corresponding old version compressed file without decompression, the third type sub-file being a file existing in both a new version compressed file and an old version compressed file, and not satisfying, in part or wholly, the preset decompression condition;

performing a merging operation on the acquired incremental file and an old version compressed file stored by itself, according to the file types in the acquired incremental file, to obtain a new version compressed file; wherein, when the incremental file comprises a first type sub-file, a first difference data file and a second difference data file, performing a merging operation in the following manner to obtain a new version compressed file: decompressing the second type sub-file in the old version compressed file, then merging with the first difference data file to obtain a first merged sub-file, and compressing the first merged sub-file to obtain a first compressed sub-file; merging the third type sub-file in the old version compressed file with the second difference data file to obtain a second merged sub-file, and compressing the second merged sub-file to obtain a second compressed sub-file; merging the first compressed sub-file, the second compressed sub-file, and the first type sub-file to obtain a new version compressed file;

using the new version compressed file to perform incremental upgrade of a file.

Optionally, the preset decompression condition comprises: the size of a file before compression is greater than a preset byte value, and the compression ratio is smaller than a preset ratio; the compression ratio is a ratio of the size of a file after compression to the size thereof before compression.

Optionally, the above decompressing the second type sub-file in the old version compressed file, then merging with the first difference data file to obtain a first merged sub-file, and compressing the first merged sub-file to obtain a first compressed sub-file comprises: the client reads and stores the file data header of the first difference data file; reads the second type sub-file in the old version compressed file corresponding to the first difference data file; decompresses the read second type sub-file; merges the decompressed second type sub-file with the first difference data file to obtain a first merged sub-file; compresses the file data header and the first merged sub-file to obtain the first compressed sub-file.

Figure 14:
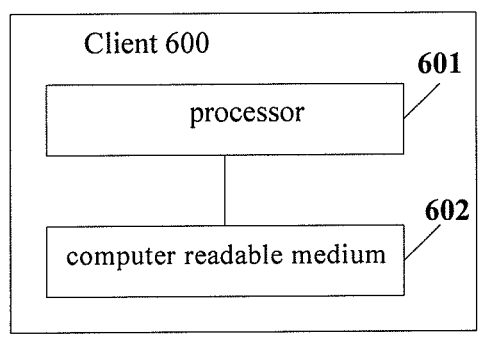
FIG. 14 is a structural block diagram of another client according to an embodiment of the present application.

The above computer readable medium may be applied on a client. As shown in FIG. 14, the client 600 according to a feasible embodiment of the present application comprises a processor 601 and the above computer readable medium 602, the processor 601 executes the program codes in the computer readable medium 602 to carry out a merging operation on the old version compressed file in the client 600 and the corresponding incremental file to obtain a corresponding new version compressed file, thereby achieving incremental upgrade of the old version compressed file.

In addition, it should be understood that the computer readable medium herein (e.g. a memory) may be a volatile memory or a nonvolatile memory, or may comprise both a volatile memory and a nonvolatile memory. As an example, not a limitation, the nonvolatile memory may comprise read-only memory (ROM), programmable ROM (PROM), electrically programmable ROM (EPROM), electrically erasable programmable ROM (EEPROM) or flash memory. The volatile memory may comprise random access memory (RAM), and said RAM may be used as an external cache memory. As an example, not a limitation, RAM may be obtained in a variety of ways, for example, synchronous RAM (DRAM), dynamic RAM (DRAM), synchronous DRAM (SDRAM), double data rate SDRAM (DDR SDRAM), enhanced SDRAM (ESDRAM), synchronous link DRAM (SLDRAM), and direct Rambus RAM (DRRAM). The memory devices in the disclosed aspects intend to include, but not to be limited to, these and other memories of appropriate types.

It should be noted that the relational terms herein, such as "first" and "second", are only used to differentiate one entity or operation from another entity or operation, which does not necessarily require or imply the existence of any of such actual relations or sequences among these entities or operations. Moreover, the terms, "including", "comprising" or any other variations thereof, intend to cover nonexclusive inclusion, such that a process, method, article or device comprising a series of elements not only comprises those elements, but also comprises other elements that are not specifically listed, or further comprises elements inherent to such a process, method, article or device. Without further limitations, the definition of an element by the sentence "comprising one . . . " does not exclude the existence of other identical elements in a process, method, article or device that comprises the element.

Only specific embodiments of the present application are described above, such that those skilled in the art can understand or implement the present application. A variety of modifications to these embodiments will be obvious for those skilled in the art, and general principles defined herein may be implemented in other embodiments without departing from the spirit or scope of the present application. Therefore, the present application will not be limited to the embodiments described herein, but will comply with the widest scope that is consistent with the principles and novel features disclosed herein.

What is claimed is:

1. A method for incremental upgrade, comprising:
acquiring, by a server, a second type sub-file, wherein the second type sub-file is in both a new version compressed file and an old version compressed file, and each of the second type sub-file in the new version compressed file and the second type sub-file in the old version compressed file satisfies a preset decompression condition;
decompressing, by the server, the second type sub-file in the new version compressed file and the second type sub-file in the old version compressed file, and performing, by the server, difference comparison to obtain a first difference data file, comprising:

writing, by the server, a file data header of the second type sub-file in the new version compressed file into a memory;

decompressing the second type sub-file in the new version compressed file and the second type sub-file in the old version compressed file;

performing difference comparison to obtain the first difference data file;

writing the first difference data file to a memory address of the file data header of the second type sub-file in the memory;

after writing the first difference data file to the memory address of the file data header of the second type sub-file in the memory, storing the first difference data file in the memory continuously with the second type sub-file; and obtaining the first difference data file according to the file data header of the second type sub-file and the first difference data file in continuous storage; and according to the first difference data file, generating, by the server, an incremental file for a client to perform incremental upgrade.

2. The method for incremental upgrade according to claim 1, wherein the preset decompression condition comprises: a size of a file before compression greater than a preset byte value, and a compression ratio smaller than a preset ratio; wherein the compression ratio is a ratio of a size of a file after compression to the size of the file before compression.

3. The method for incremental upgrade according to claim 1, further comprising:

acquiring, by the server, a third type sub-file, wherein the third type sub-file is in both the new version compressed file and the old version compressed file, and at least one of the third type sub-file in the new version compressed file and the third type sub-file in the old version compressed file does not satisfy the preset decompression condition;

performing, by the server, difference comparison between the third type sub-file in the new version compressed file and the third type sub-file in the old version compressed file without decompression, to obtain a second difference data file, comprising:

determining, by the server, that a plurality of third type sub-files with continuous memory addresses exist in the new version compressed file;

determining, by the server, that a corresponding plurality of third type sub-files in the old version compressed file also have continuous memory addresses;

using the plurality of third type sub-files with continuous memory addresses in the new version compressed file as a first integral file;

using the plurality of third type sub-files with continuous memory addresses in the old version compressed file as a second integral file; and performing difference comparison between the first integral file and the second integral file without decompression to obtain the second difference data file.

4. The method for incremental upgrade according to claim 3, further comprising acquiring, by the server, a first type sub-file, wherein the first type sub-file is in the new version compressed file and not in the old version compressed file, wherein generating the incremental file for the client to perform incremental upgrade is further according to the first type sub-fileand the second difference data file.

5. The method for incremental upgrade according to claim 1, wherein, before acquiring, by the server, the second type sub-file, the method further comprises:

receiving, by the server, a file upgrade request sent from the client; and upon receiving the file upgrade request, carrying out, by the server, the step of acquiring the second type sub-file.

6. The method for incremental upgrade according to claim 1, further comprising acquiring, by the server, a first type sub-file, wherein the first type sub-file is in the new version compressed file and not in the old version compressed file, wherein generating the incremental file for the client to perform incremental upgrade is further according to the first type sub-file.

7. A method for incremental upgrade, comprising:

acquiring, by a client, an incremental file from a server, wherein the incremental file comprises a first difference data file, wherein the first difference data file is a file obtained by decompressing a second type sub-file in a new version compressed file and the second type sub-file in a corresponding old version compressed file, and performing difference comparison, comprising:

writing, by the server, a file data header of the second type sub-file in the new version compressed file into a memory;

decompressing the second type sub-file in the new version compressed file and the second type sub-file in the corresponding old version compressed file;

performing difference comparison to obtain the first difference data file;

writing the first difference data file to a memory address of the file data header of the second type sub-file in the memory;

after writing the first difference data file to the memory address of the file data header of the second type sub-file in the memory, storing the first difference data file in the memory continuously with the second type sub-file; and obtaining the first difference data file according to the file data header of the second type sub-file and the first difference data file in continuous storage;

wherein each of the second type sub-file in the new version compressed file and the second type sub-file in the corresponding old version compressed file satisfies a preset decompression condition; and using, by the client, the incremental file to obtain the new version compressed file, wherein the using comprises: decompressing the second type sub-file in the corresponding old version compressed file; merging the decompressed second type sub-file with the first difference data file to obtain a first merged sub-file; compressing the first merged sub-file to obtain a first compressed sub-file; and using at least the first compressed sub-file to obtain the new version compressed file.

8. The method for incremental upgrade according to claim 7, further comprising:

reading, by the client, a file data header of the first difference data file;

storing, by the client, the file data header of the first difference data file;

reading the second type sub-file in the corresponding old version compressed file corresponding to the first difference data file;

after reading the second type sub-file, decompressing the second type sub-file;

merging the decompressed second type sub-file with the first difference data file to obtain the first merged sub-file; and compressing the file data header and the first merged sub-file to obtain the first compressed sub-file.

9. The method for incremental upgrade according to claim 7, wherein the preset decompression condition comprises: a size of a file before compression is greater than a preset byte value, and a compression ratio is smaller than a preset ratio; wherein the compression ratio is a ratio of a size of a file after compression to the size of the file before compression.

10. The method for incremental upgrade according to claim 7, wherein the incremental file further comprises a first type sub-file, wherein the first type sub-file is in the new version compressed file and not in the corresponding old version compressed file, wherein using, by the client, the incremental file to obtain the new version compressed file further comprises merging the first compressed sub-file and the first type sub-file, wherein using at least the first compressed sub-file to obtain the new version compressed file further comprises using the first compressed sub-file.

11. The method for incremental upgrade according to claim 10, wherein the incremental file further comprises a second difference data file, wherein the second difference data file is a file obtained by performing difference comparison between a third type sub-file in the new version compressed file and the third type sub-file in the corresponding old version compressed file without decompression, wherein at least one of the third type sub-file in the new version compressed file and the third type sub-file in the old version compressed file does not satisfy the preset decompression condition, wherein using, by the client, the incremental file to obtain the new version compressed file further comprises:

merging the third type sub-file in the old version compressed file with the second difference data file to obtain a second merged sub-file;

compressing the second merged sub-file to obtain a second compressed sub-file; and merging the first compressed sub-file, the second compressed sub-file, and the first type sub-file to obtain the new version compressed file.

12. A non-transitory computer readable medium, wherein the non-transitory computer readable medium is on the server and has computer-readable program code portions stored, wherein the computer-readable program code portions comprising an executable portion configured to trigger the server to carry out the method for incremental upgrade according to claim 1.

13. A non-transitory computer readable medium, wherein, the non-transitory computer readable medium is on the client and has computer-readable program code portions stored, wherein the computer-readable program code portions comprising an executable portion configured to trigger the client to carry out the method for incremental upgrade according to claim 7.

14. A server comprising a processor and a non-transitory memory including computer program code, the non-transitory memory and the computer program code configured to, with the processor, cause the server to:

acquire a second type sub-file, wherein the second type sub-file is in both a new version compressed file and an old version compressed file, and each of the second type sub-file in the new version compressed file and the second type sub-file in the old version compressed file satisfies a preset decompression condition;

decompress the second type sub-file in the new version compressed file and the second type sub-file in the old version compressed file, and perform difference comparison to obtain a first difference data file, wherein the non-transitory memory and the computer program code further configured to, with the processor, cause the server to:

write a file data header of the second type sub-file in the new version compressed file into a memory;

decompress the second type sub-file in the new version compressed file and the second type sub-file in the old version compressed file, and perform difference comparison to obtain the first difference data file;

write the first difference data file to a memory address of the file data header of the second type sub-file in the memory;

store, after the first difference data file is written to the memory address of the file data header of the second type sub-file in the memory, the first difference data file in the memory continuously with the second type sub-file; and obtain the first difference data file according to the file data header of the second type sub-file and the first difference data file in continuous storage; and according to the first difference data file, generate an incremental file for a client to perform incremental upgrade.

15. The server according to claim 14, wherein the preset decompression condition comprises: a size of a file before compression greater than a preset byte value, and a compression ratio smaller than a preset ratio; wherein the compression ratio is a ratio of a size of a file after compression to the size of the file before compression.

16. The server according to claim 14, wherein the non-transitory memory and the computer program code configured to, with the processor, cause the server to:

acquire a third type sub-file, wherein the third type sub-file is in both the new version compressed file and the old version compressed file, and at least one of the third type sub-file in the new version compressed file and the third type sub-file in the old version compressed file does not satisfy the preset decompression condition; and decompress the second type sub-file in the new version compressed file and the second type sub-file in the old version compressed file further comprises:

determining that a plurality of third type sub-files with continuous memory addresses exist in the new version compressed file, and determining that a corresponding plurality of third type sub-files in the old version compressed file also have continuous memory addresses;

using the plurality of third type sub-files with continuous memory addresses in the new version compressed file as a first integral file, and using the plurality of third type sub-files with continuous memory addresses in the old version compressed file as a second integral file; and performing difference comparison between the first integral file and the second integral file without decompression, to obtain a second difference data file.

17. The server according to claim 16, wherein the non-transitory memory and the computer program code configured to, with the processor, cause the server to further acquire a first type sub-file, wherein the first type sub-file is in the new version compressed file and not in the old version compressed file, wherein generating the incremental file for the client to perform incremental upgrade is further according to the first type sub-file and the second difference data file.

18. The server according to claim 14, wherein the non-transitory memory and the computer program code are configured to, with the processor, cause the server to:
before acquiring the second type sub-file, receive a file upgrade request sent from the client.

19. The server according to claim 14, wherein the non-transitory memory and the computer program code configured to, with the processor, cause the server to further acquire a first type sub-file, wherein the first type sub-file is in the new version compressed file and not in the old version compressed file, wherein generating the incremental file for the client to perform incremental upgrade is further according to the first type sub-file.

20. A client comprising a processor and a non-transitory memory including computer program code, the non-transitory memory and the computer program code configured to, with the processor, cause the client to:
acquire an incremental file from a server, wherein the incremental file comprises a first difference data file, wherein the first difference data file is a file obtained by decompressing a second type sub-file in a new version compressed file and the second type sub-file in a corresponding old version compressed file, and performing difference comparison, wherein the non-transitory memory and the computer program code further configured to, with the processor, cause the client to:
write a file data header of the second type sub-file in the new version compressed file into a memory;
decompress the second type sub-file in the new version compressed file and the second type sub-file in the corresponding old version compressed file, and perform difference comparison to obtain the first difference data file;
write, the first difference data file to a memory address of the file data header of the second type sub-file in the memory;
store, after the first difference data file is written to the memory address of the file data header of the second type sub-file in the memory, the first difference data file in the memory continuously with the second type sub-file; and
obtain the first difference data file according to the file data header of the second type sub-file and the first difference data file in continuous storage;
wherein each of the second type sub-file in the new version compressed file and the second type sub-file in the corresponding old version compressed file satisfies a preset decompression condition;
use the incremental file to obtain the new version compressed file, wherein the using comprises: decompressing the second type sub-file in the corresponding old version compressed file, merging with the first difference data file to obtain a first merged sub-file, compressing the first merged sub-file to obtain a first compressed sub-file, and using at least the first compressed sub-file to obtain the new version compressed file.

21. The client according to claim 20, wherein the preset decompression condition comprises: a size of a file before compression is greater than a preset byte value, and a compression ratio is smaller than a preset ratio; wherein the compression ratio is a ratio of a size of a file after compression to the size of the file before compression.

22. The client according to claim 20, wherein the incremental file further comprises a first type sub-file, wherein the first type sub-file is in the new version compressed file and not in the corresponding old version compressed file, wherein using, the incremental file to obtain the new version compressed file further comprises merging the first compressed sub-file and the first type sub-file, wherein using at least the first compressed sub-file to obtain the new version compressed file further comprises using the first compressed sub-file.

* * * * *